(12) United States Patent
Shin

(10) Patent No.: US 10,468,252 B2
(45) Date of Patent: Nov. 5, 2019

(54) SEMICONDUCTOR DEVICE AND METHOD OF MANUFACTURING THE SAME

(71) Applicant: Samsung Electronics Co., Ltd., Suwon-si (KR)

(72) Inventor: Jongchan Shin, Seongnam-si (KR)

(73) Assignee: SAMSUNG ELECTRONICS CO., LTD., Samsung-ro, Yeongton-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/185,137

(22) Filed: Nov. 9, 2018

(65) Prior Publication Data
US 2019/0311902 A1   Oct. 10, 2019

(30) Foreign Application Priority Data
Apr. 9, 2018 (KR) .......................... 10-2018-0041021

(51) Int. Cl.
*H01L 21/033* (2006.01)
*H01L 21/311* (2006.01)
*H01L 21/3105* (2006.01)
*H01L 23/528* (2006.01)

(52) U.S. Cl.
CPC ...... *H01L 21/0337* (2013.01); *H01L 21/0332* (2013.01); *H01L 21/31053* (2013.01); *H01L 21/31144* (2013.01); *H01L 23/528* (2013.01)

(58) Field of Classification Search
CPC ............. H01L 21/0332; H01L 21/0337; H01L 21/31053; H01L 21/31144
See application file for complete search history.

(56) References Cited

U.S. PATENT DOCUMENTS

| 8,048,762 | B2 | 11/2011 | Ohuchi |
| 9,093,378 | B2 | 7/2015 | Kim et al. |
| 9,368,349 | B2 | 6/2016 | Huang et al. |
| 9,490,136 | B1 | 11/2016 | Chang et al. |
| 9,502,261 | B2 | 11/2016 | Liu et al. |
| 9,581,900 | B2 | 2/2017 | Shieh et al. |
| 9,698,016 | B2 | 7/2017 | Huang et al. |
| 9,773,676 | B2 | 9/2017 | Chang et al. |
| 9,786,554 | B1 | 10/2017 | Burns et al. |
| 9,847,227 | B2 | 12/2017 | Kang |
| 2014/0083972 | A1 | 3/2014 | Oyama et al. |
| 2014/0193974 | A1* | 7/2014 | Lee .................. H01L 21/76818 438/669 |
| 2017/0338116 | A1* | 11/2017 | deVilliers ........... H01L 21/0332 |
| 2017/0358487 | A1 | 12/2017 | Burns et al. |

* cited by examiner

*Primary Examiner* — Peniel M Gumedzoe
(74) *Attorney, Agent, or Firm* — Muir Patent Law, PLLC

(57) ABSTRACT

Disclosed are semiconductor devices and methods of manufacturing the same. The method comprises sequentially forming a target layer and a first mask layer on a substrate, patterning the first mask layer to form a first opening in the first mask layer, forming a spacer covering an inner wall of the first opening, forming on the first mask layer a first photoresist pattern having a second opening vertically overlapping at least a portion of the spacer, forming a third opening in the first mask layer that is adjacent to the first opening by using the spacer as a mask to remove a portion of the first mask layer that is exposed to the second opening, and using the first mask layer and the spacer as a mask to pattern the target layer.

13 Claims, 45 Drawing Sheets

SEMICONDUCTOR DEVICE AND METHOD OF MANUFACTURING THE SAME

CROSS-REFERENCE TO RELATED APPLICATION

This U.S. nonprovisional application claims priority under 35 U.S.C § 119 to Korean Patent Application No. 10-2018-0041021 filed on Apr. 9, 2018 in the Korean Intellectual Property Office, the entire contents of which are hereby incorporated by reference.

BACKGROUND

Inventive concepts relate to a semiconductor device and a method of manufacturing the same, and more particularly, to a method of manufacturing a semiconductor device, in which method a spacer is used as a mask, and a semiconductor device manufactured by the same.

Semiconductor devices (or semiconductor chips) are beneficial in electronic industry because of their small size, multi-functionality, and/or low fabrication cost. Semiconductor devices include semiconductor memory devices storing data, semiconductor logic devices including circuitry to process logic operations, and hybrid semiconductor devices having both memory and logic circuits. Semiconductor devices continued to be required for high integration with the advanced development of electronic industry, providing high reliability, high speed, and/or multi-functionality. Semiconductor devices continue to become more complicated and integrated to meet these demands.

Double patterning technology is a technique used to form a pattern at widths less than the minimum pitch that can be achieved by an exposure apparatus without changing the exposure apparatus. For example, the formation of fine patterns uses the double patterning technology by which spacers are formed on sidewalls of a sacrificial pattern formed by a photolithography process, the sacrificial pattern is removed, and then only the spacers are used as an etching mask to etch an etching target. As semiconductor devices increase in integration, there is an increasing demand for advanced technology for forming much finer patterns.

SUMMARY

Some embodiments of inventive concepts provide a method of manufacturing a semiconductor device, which method is capable of minimizing or reducing a pattern width, and a semiconductor device manufactured by the same.

According to some exemplary embodiments of inventive concepts, a method of manufacturing a semiconductor device may comprise: sequentially forming a target layer and a first mask layer on a substrate; forming a first opening by patterning the first mask layer; forming a spacer on an inner wall of the first opening; forming on the first mask layer a first photoresist pattern having a second opening vertically overlapping at least a portion of the spacer; forming a third opening adjacent to the first opening by using the spacer as a mask to remove a portion of the first mask layer that is exposed to the second opening; and using the resulting first mask layer and the spacer as a mask to pattern the target layer.

According to some exemplary embodiments of inventive concepts, a method of manufacturing a semiconductor device may comprise: sequentially forming a target layer and a first mask layer on a substrate; performing a first photolithography process to form a first opening in the first mask layer; forming a spacer covering an inner wall of the first opening to define a second opening within the first opening; and performing a second photolithography process to form in the first mask layer a third opening adjacent to the first opening with the spacer being disposed therebetween. The spacer may be used to form the third opening in a self-alignment manner.

According to some exemplary embodiments of inventive concepts, a semiconductor device may comprise: an insulating layer on a substrate; and a first metal line and a second metal line adjacent in a first direction to the first metal line, the first and second metal lines being formed in the insulating layer. The first and second metal lines may extend in parallel to each other in a second direction intersecting the first direction. The first metal line may comprise: a first segment extending in the second direction; and a second segment at an end of the first segment and having a width that decreases toward the second direction. The second metal line may comprise: a third segment extending in the second direction and adjacent to the first segment; and a fourth segment adjacent to the second segment and having a width that increases toward the second direction. A minimum distance between the first segment and the third segment may be substantially the same as a minimum distance between the second segment and the fourth segment.

BRIEF DESCRIPTION OF THE DRAWINGS

FIGS. 8A to 23A illustrate plan views showing a method of manufacturing a semiconductor device, according to exemplary embodiments of inventive concepts.

FIGS. 8B to 23B illustrate cross-sectional views taken along line A-A' of FIGS. 8A to 23A, respectively.

FIGS. 8C to 23C illustrate cross-sectional views taken along line B-B' of FIGS. 8A to 23A, respectively.

DETAILED DESCRIPTION OF EMBODIMENTS

Figure 1:
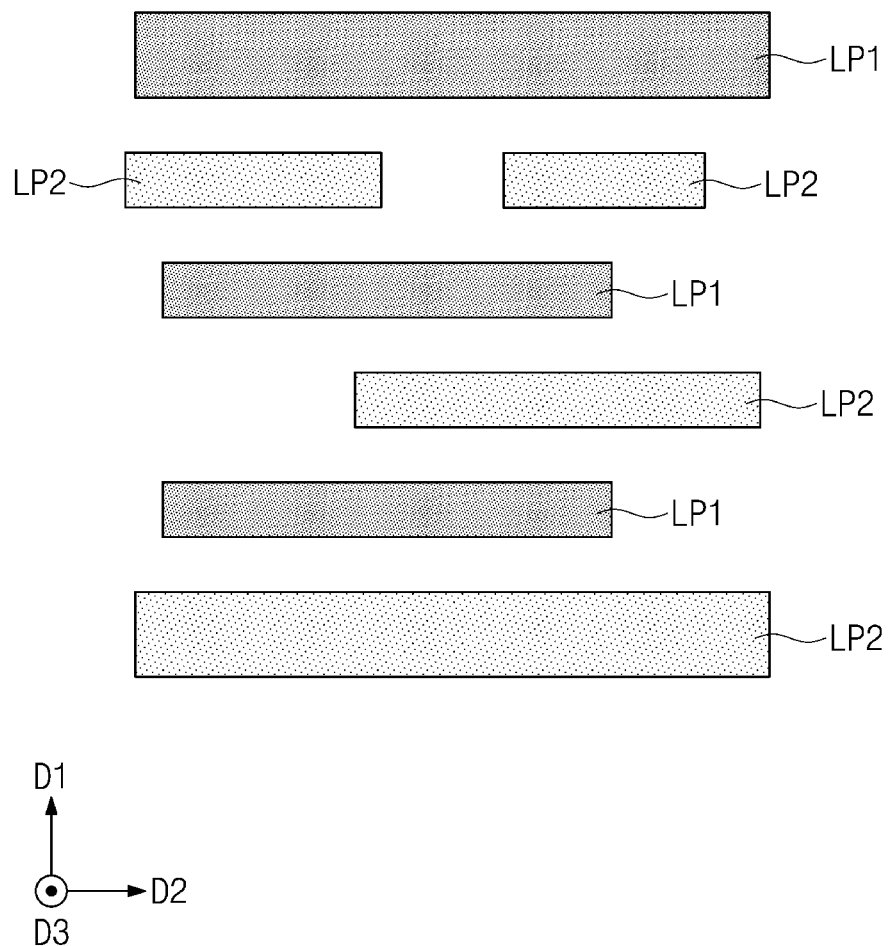
FIG. 1 illustrates a plan view showing a layout defining a metal layer of a semiconductor device, according to exemplary embodiments of inventive concepts.

FIG. 1 illustrates a plan view showing a layout objective of a metal layer of a semiconductor device, according to exemplary embodiments of inventive concepts.

Referring to FIG. 1, layout patterns LP1 and LP2 may be provided. The layout patterns LP1 and LP2 may correspond to an ideal design of a layer, such as a metal layer, of a semiconductor device. The layout patterns LP1 and LP2 may include first layout patterns LP1 and second layout patterns LP2.

A first photomask may be fabricated based on the first layout patterns LP1, and a second photomask may be fabricated based on the second layout patterns LP2. For example, the layout shown in FIG. 1 may be used to separately derive and fabricate a total of two photomasks. The first and second photomasks may be used to form respective patterns on a substrate.

FIGS. 2A, 3A, 4A, 5A, and 6A illustrate plan views showing a method of manufacturing a semiconductor device, according to exemplary embodiments of inventive concepts. FIGS. 2B, 3B, 4B, 5B, and 6B illustrate cross-sectional views taken along line A-A' of FIGS. 2A, 3A, 4A, 5A, and 6A, respectively.

Figure 2A:
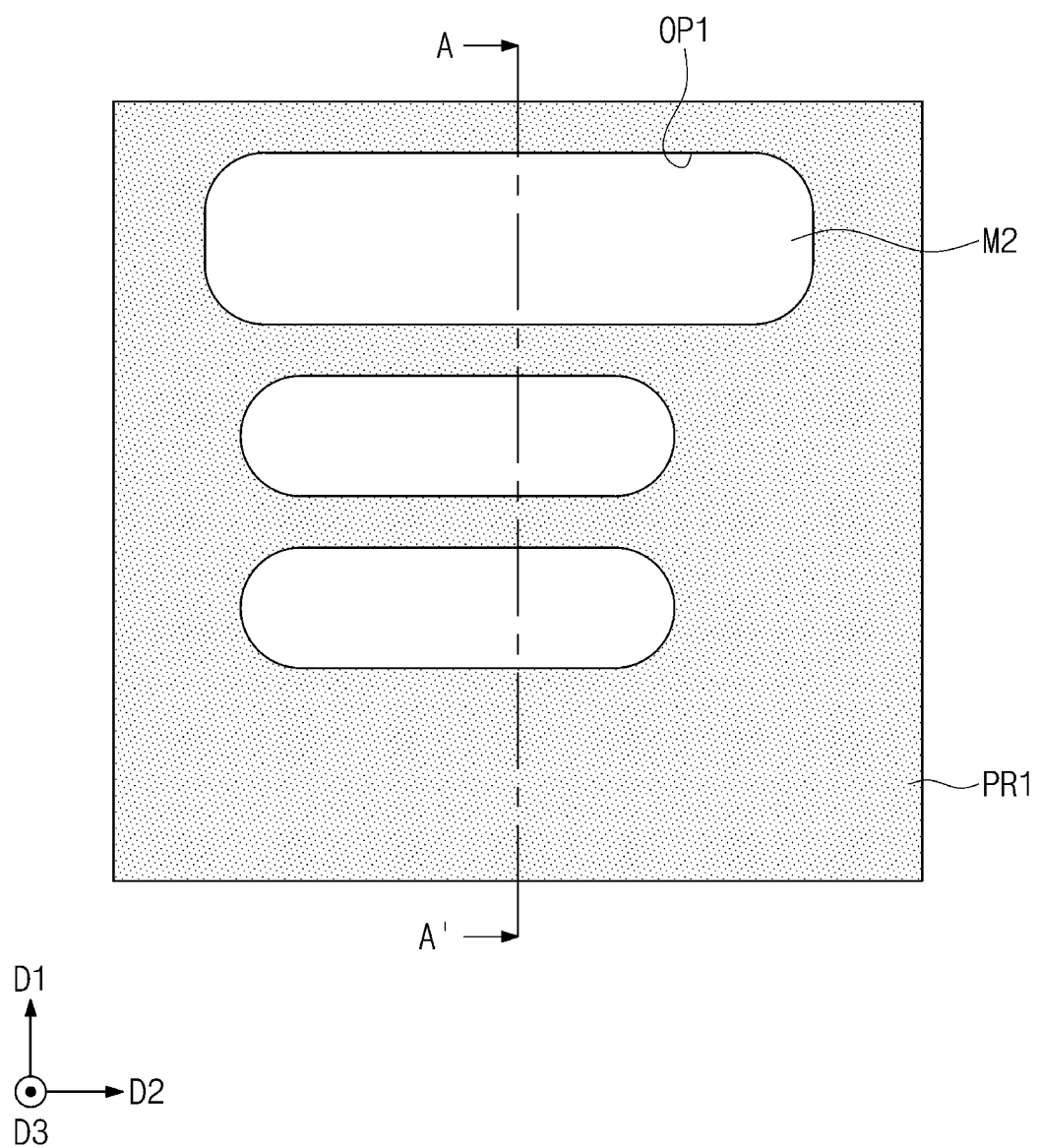
FIGS. 2A, 3A, 4A, 5A, and 6A illustrate plan views showing a method of manufacturing a semiconductor device, according to exemplary embodiments of inventive concepts.
Figure 2B:
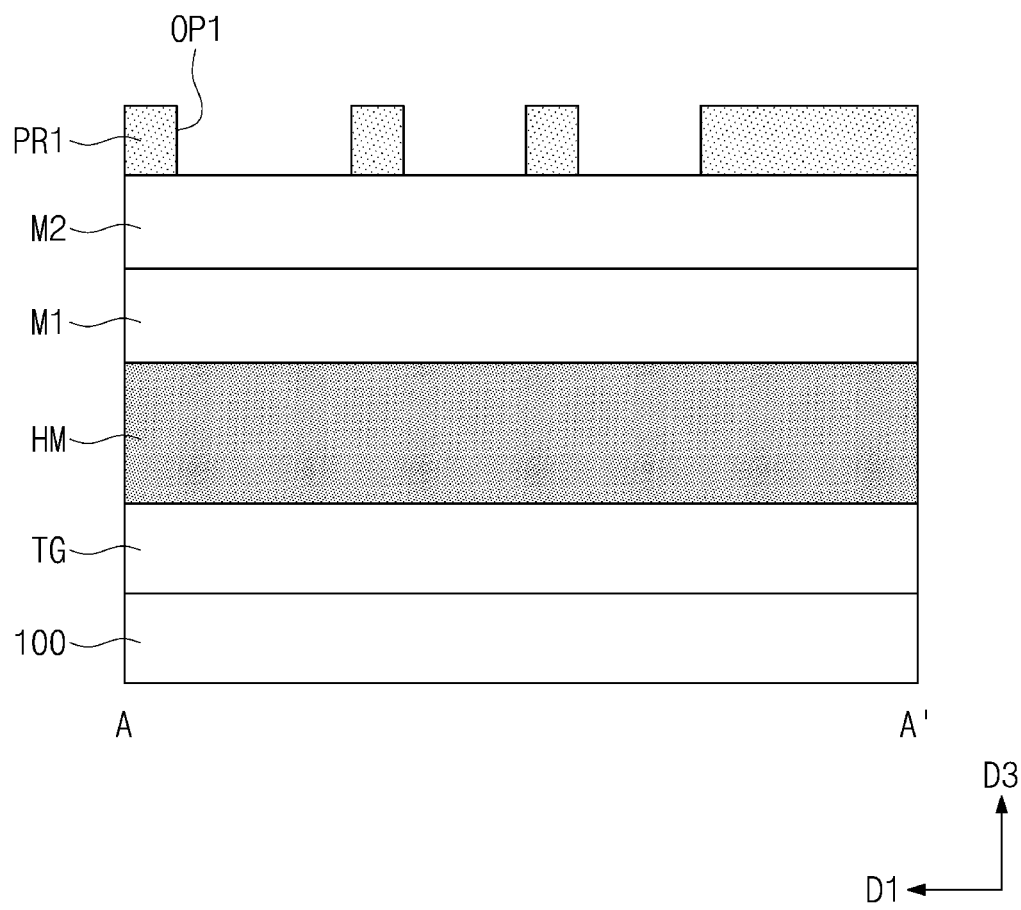
FIGS. 2B, 3B, 4B, 5B, and 6B illustrate cross-sectional views taken along line A-A' of FIGS. 2A, 3A, 4A, 5A, and 6A, respectively.

Referring to FIGS. 2A and 2B, a target layer TG, a hardmask layer HM, a first mask layer M1, and a second mask layer M2 may be sequentially formed on a substrate 100. The substrate 100 may be or include a crystalline semiconductor substrate. For example, the substrate 100 may be one of a silicon substrate, a germanium substrate, a silicon-germanium substrate, and a compound semiconductor substrate. The hardmask layer HM may be formed of, for example, titanium nitride (TiN). The target layer TG may be, for example, an insulating layer, such as silicon nitride (SiN) or silicon oxide ($SiO_2$) or may be a conductive layer (e.g., doped polysilicon). The first mask layer M1 may be formed of, for example, one or more of an amorphous silicon layer, a spin-on-hardmask (SOH) layer, a spin-on-glass (SOG) layer, a silicon nitride (SiN) layer, a silicon oxycarbonitride (SiOCN) layer, a silicon carbonitride (SiCN) layer, and a tin oxide (SnOx) layer. The second mask layer M2 may be formed of, for example, one or more of a silicon-containing antireflection coating (SiARC) layer, a spin-on-hardmask (SOH) layer, and an amorphous carbon layer.

A first photoresist pattern PR1 having first openings OP1 may be formed on the second mask layer M2. For example, the formation of the first photoresist pattern PR1 may include forming a first photoresist layer on the second mask layer M2, and then using the first photomask referenced with respect to FIG. 1 as a photomask to perform a first photolithography process on the first photoresist layer. The first photolithography process may include performing conventional exposure and development processes of the first photoresist layer. The first layout patterns LP1 of FIG. 1 may correspond to the first openings OP1 and be used to design the first photomask used in the first photolithography process to selectively expose the first photoresist layer.

Figure 3A:
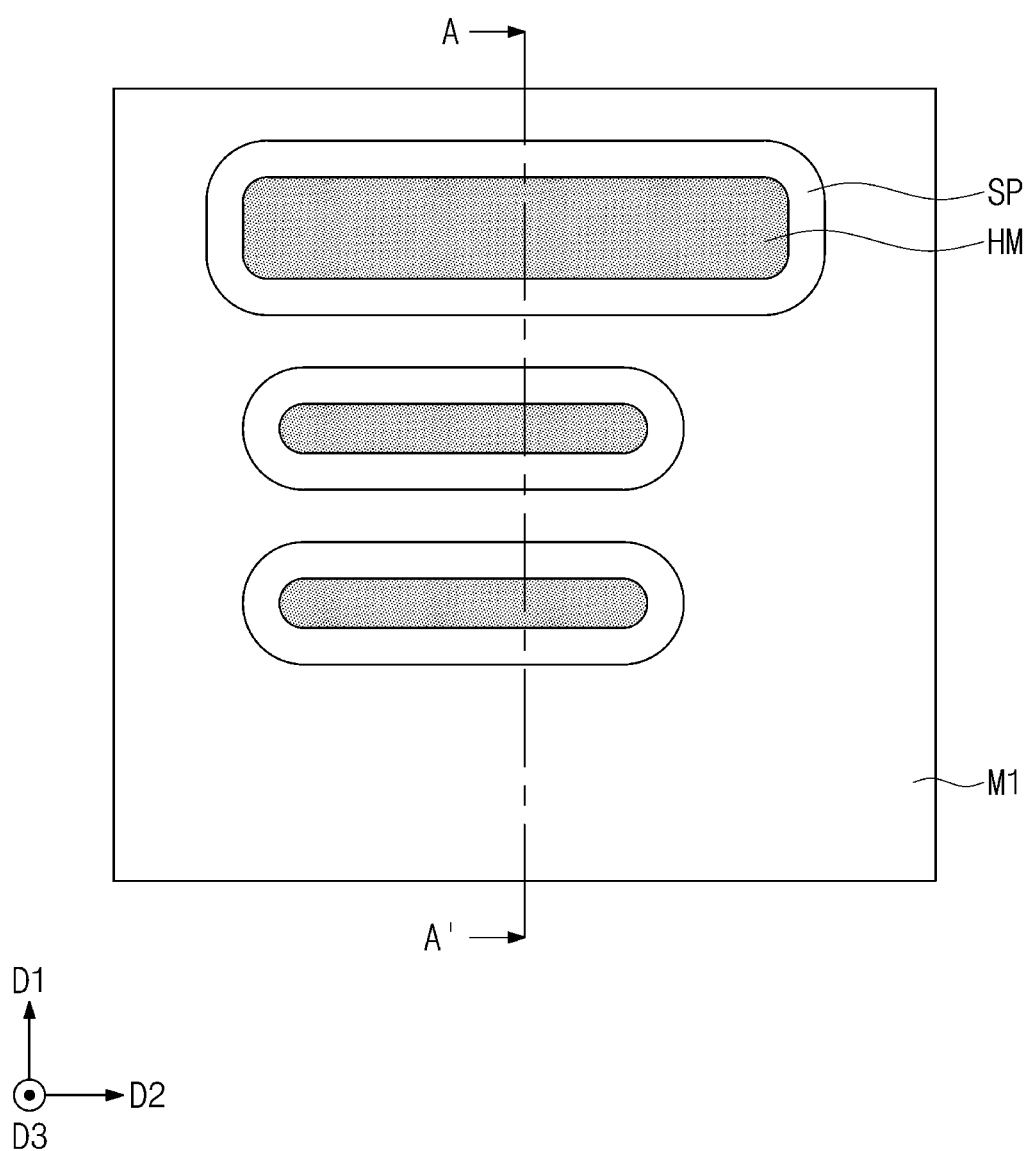
Figure 3B:
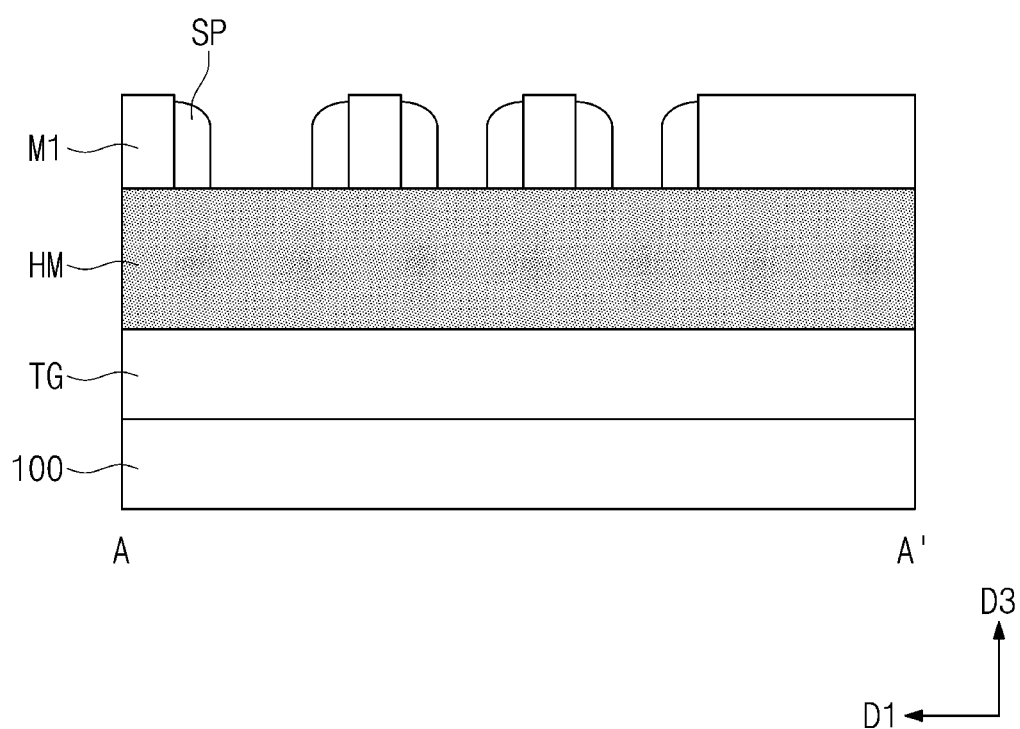

Referring to FIGS. 3A and 3B, a first patterning process may be performed using the first photoresist pattern PR1 as a mask. For example, the performing of the first patterning process may include using the first photoresist pattern PR1 as a mask to pattern the second mask layer M2 (forming a hard mask from the second mask layer M2), and then using this hard mask (the patterned second mask layer M2) as a mask to pattern the first mask layer M1. A removal process may be performed on the first photoresist pattern PR1 and the second mask layer M2 that remain after the first patterning process.

Spacers SP may be formed on sidewalls of the patterned first mask layer M1. For example, the formation of the spacers SP may include conformally forming a spacer layer on an entire surface of the substrate 100 and performing an anisotropic etching process on the spacer layer. The spacers SP may be formed of, for example, one or more of titanium oxide (TiOx), silicon oxide (SiOx), silicon nitride (SiN), silicon oxynitride (SiON), aluminum oxide (AlOx), and tin oxide (SnOx).

Figure 4A:
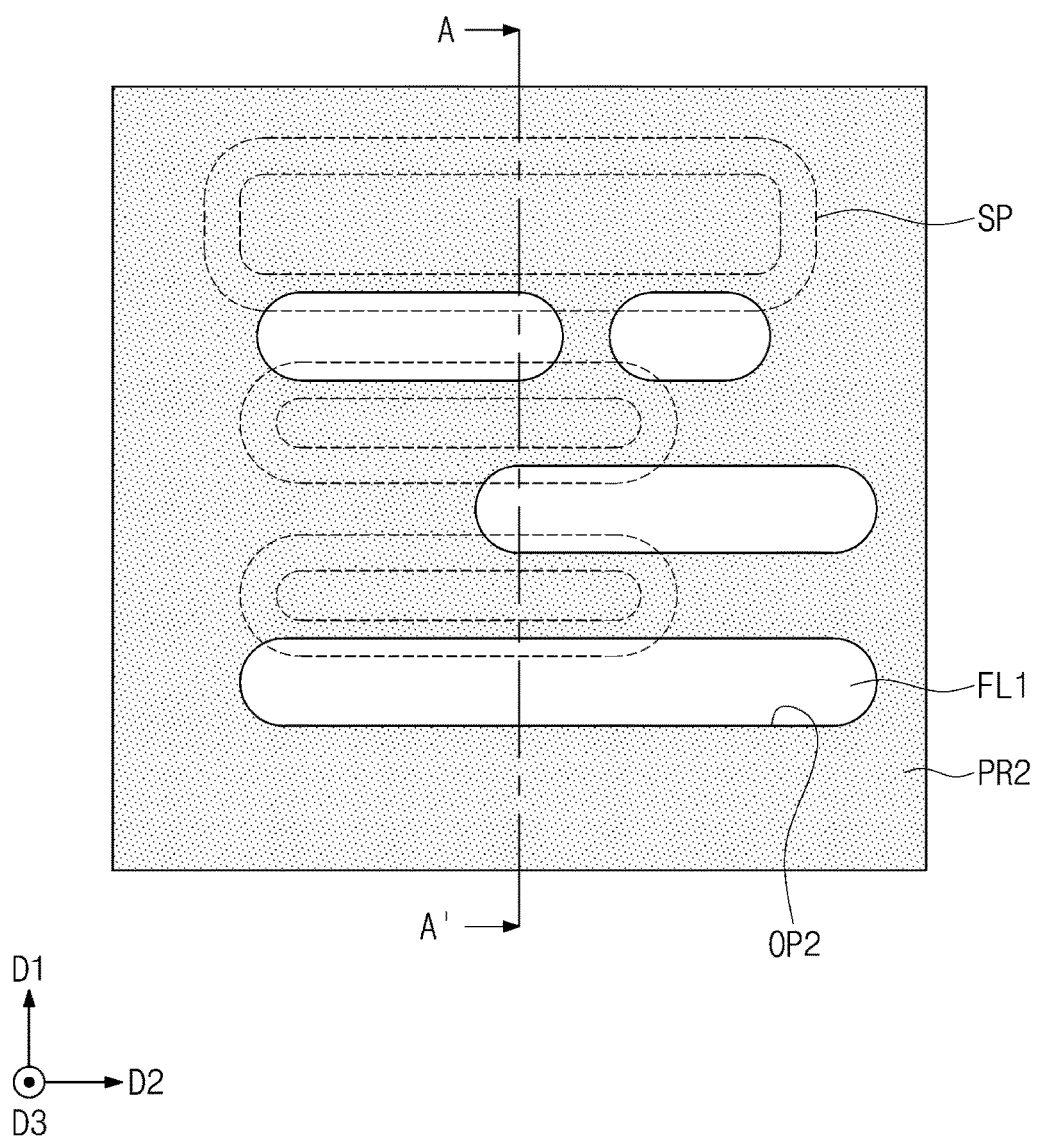
Figure 4B:
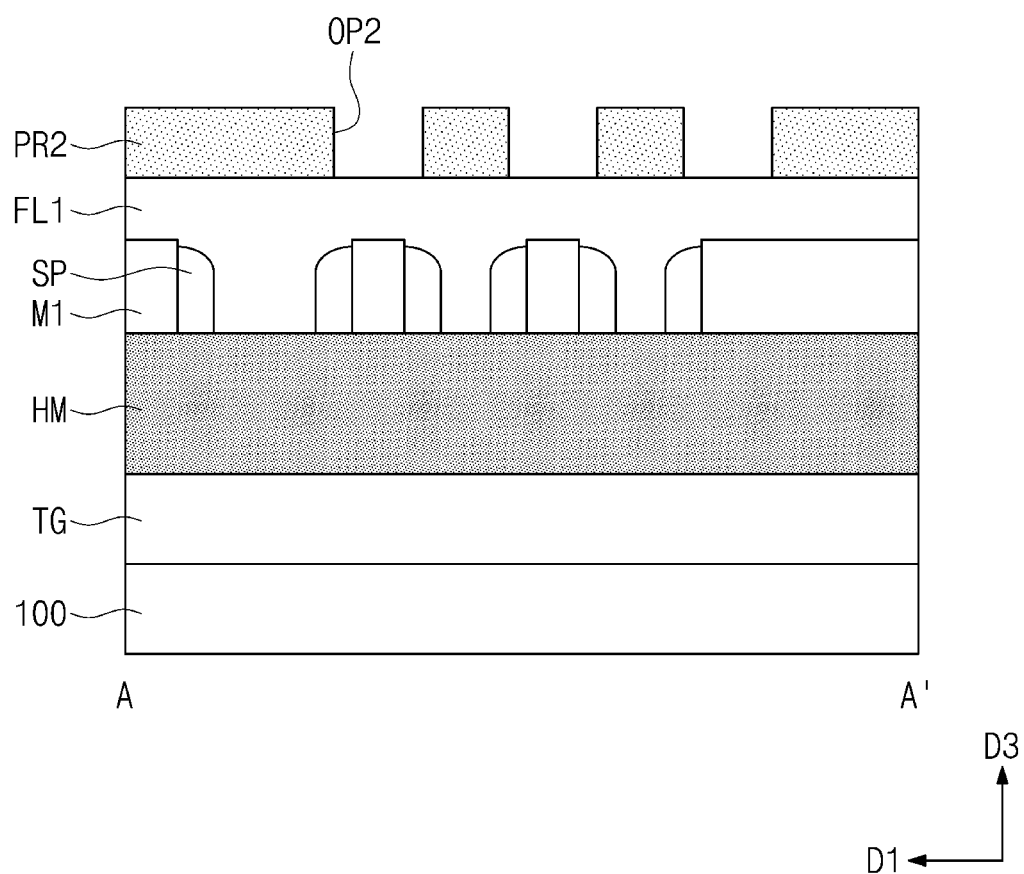

Referring to FIGS. 4A and 4B, a first filling layer FL1 may be formed on the entire surface of the substrate 100. For example, the first filling layer FL1 may include a spin-on-hardmask (SOH) layer. The first filling layer FL1 may have a flat (e.g., planar) upper surface.

A second photoresist pattern PR2 having second openings OP2 may be formed on the first filling layer FL1. For example, the formation of the second photoresist pattern PR2 may include forming a second photoresist layer on the first filling layer FL1, and then using the second photomask referenced with respect to FIG. 1 as a photomask to perform a second photolithography process on the second photoresist layer. The second photolithography process may include performing conventional exposure and development processes on the second photoresist layer. The second layout patterns LP2 of FIG. 2 may correspond to the second openings OP2 and be used to design the second photomask used in the second photolithography process to selectively expose the second photoresist layer.

Some or all of the second openings OP2 of the second photoresist pattern PR2 may vertically overlap at least a portion of one of the spacers SP. For example, second openings OP2 may have sidewalls that are positioned directly above an opening formed in the first mask layer M1 from the first patterning process described with respect to FIGS. 3A and 3B, such as directly above one of the spacers SP. With respect to a vertical cross section, such as that shown in FIG. 4B, a second opening OP2 may be positioned directly above a discrete portion of the first mask layer M1 and have sidewalls horizontally positioned to either side of this discrete portion of the first mask layer M1.

Figure 5A:
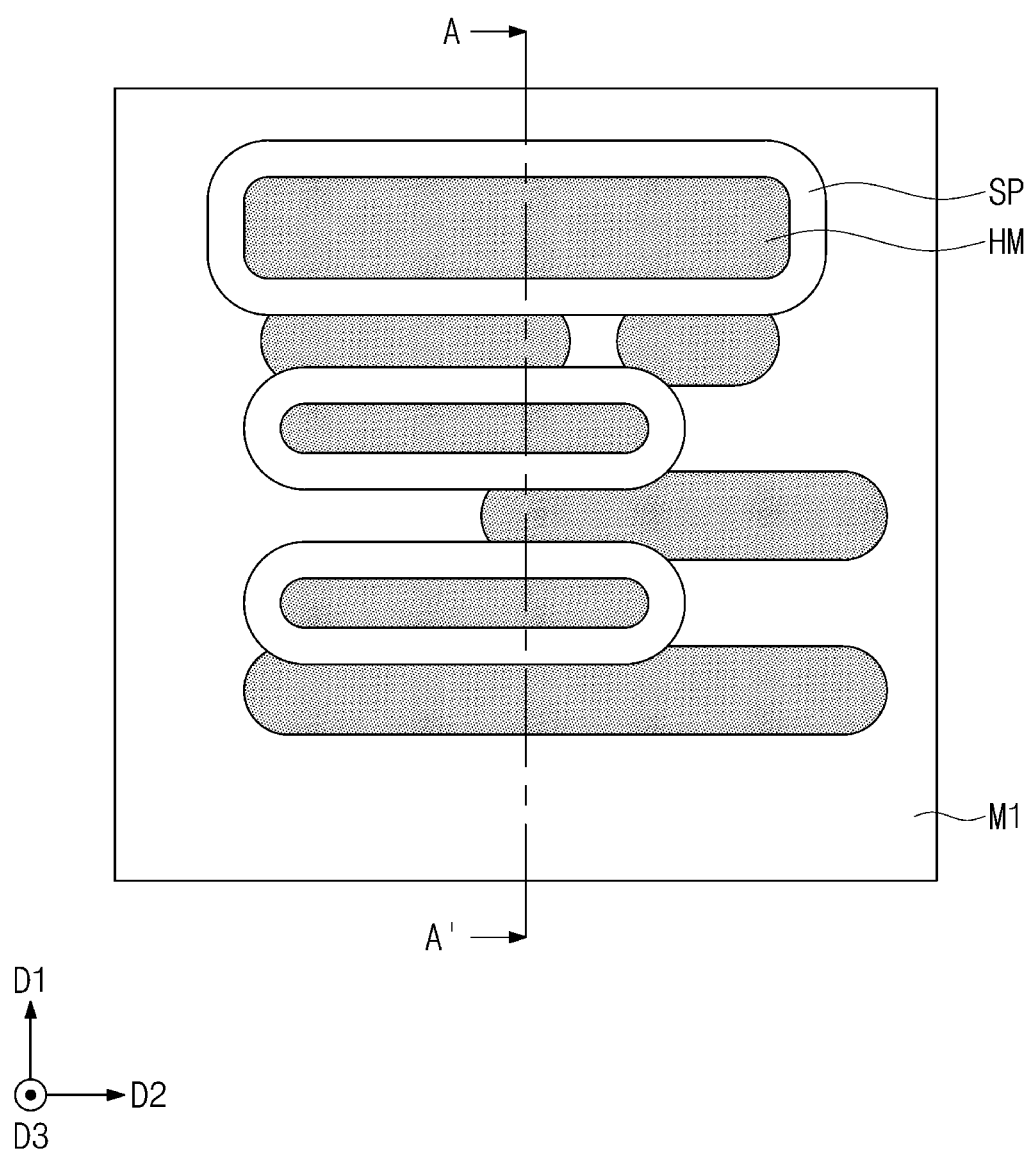
Figure 5B:
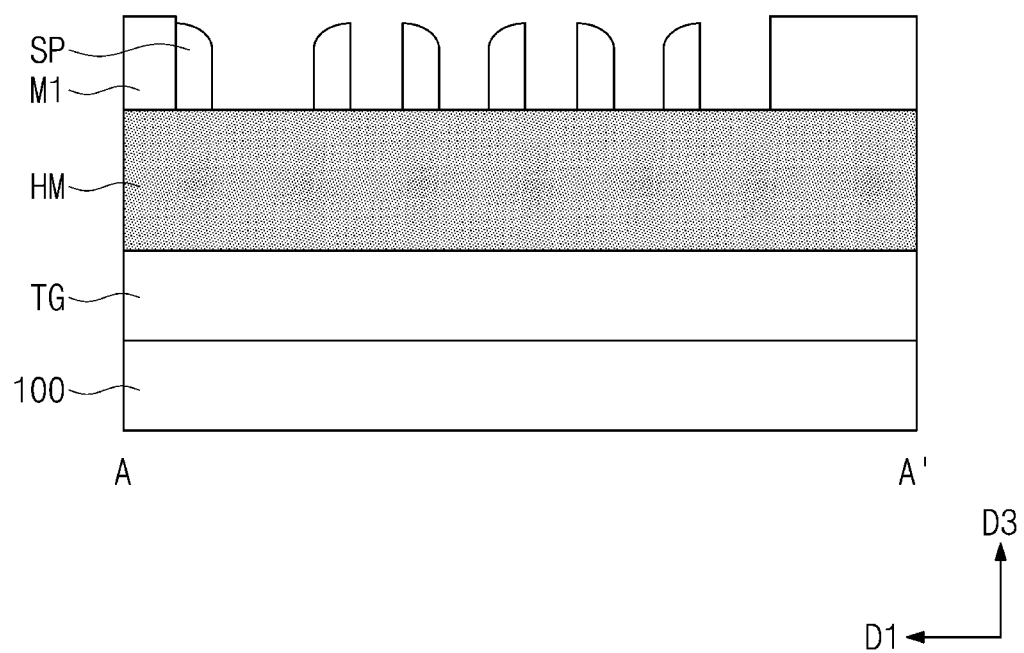

Referring to FIGS. 5A and 5B, a second patterning process may be performed using the second photoresist pattern PR2 as a mask. For example, the performing of the second patterning process may include using the second photoresist pattern PR2 as a mask to pattern the first filling layer FL1, and then using the patterned first filling layer FL1 and the spacers SP as a mask to pattern the first mask layer M1. Since the second openings OP2 of the second photoresist pattern PR2 vertically overlap the spacers SP, the spacers SP may serve as an etching mask when the first mask layer M1 is patterned during the second patterning process. During the second patterning process, the spacers SP may be used to pattern the first mask layer M1 in a self-alignment manner Although openings OP1 and OP2 may have overlapping footprints on first mask layer M1, spacers SP may act to separate the portions of the first mask layer M1 exposed via patterning processes using openings OP1 and OP2, as shown in FIG. 5A. A removal process may be performed to remove the second photoresist pattern PR2 and the first filling layer FL1 that remain after the second patterning process.

Figure 6A:
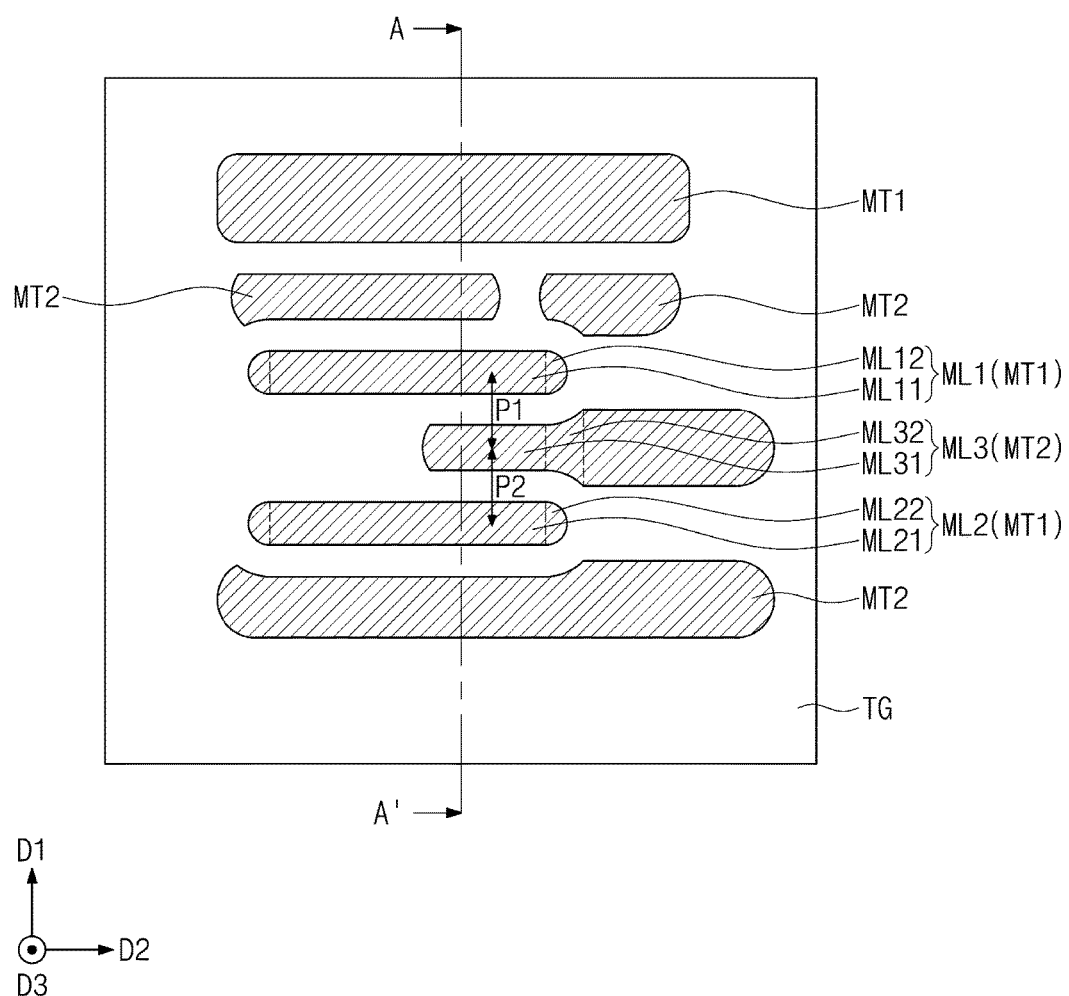
Figure 6B:
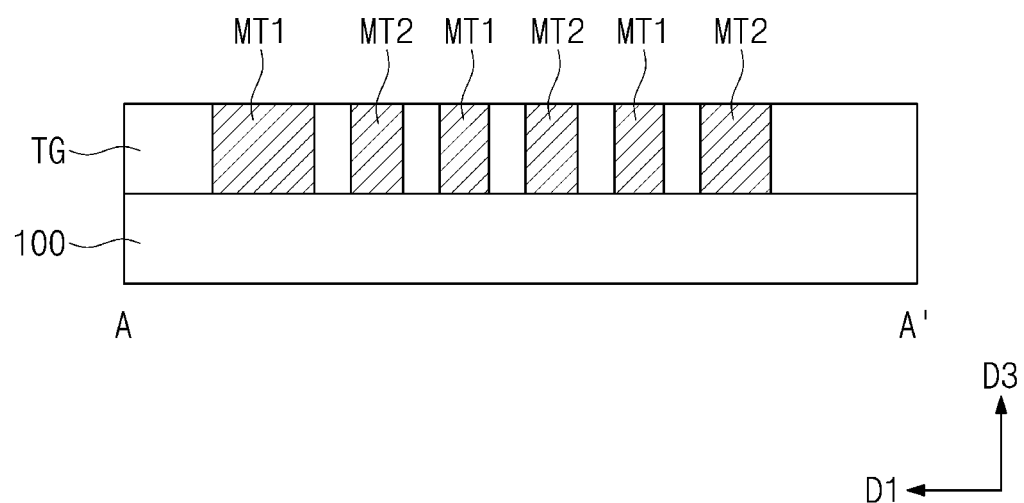

Referring to FIGS. 6A and 6B, a third patterning process may be performed using the spacers SP and the first mask layer M1 as a mask. For example, the performing of the third patterning process may include using the spacers SP and the first mask layer M1 as a mask to pattern the hardmask layer HM, and then using the patterned hardmask layer HM as a mask to pattern the target layer TG. A removal process may be performed on remaining portions of the spacers SP, the first mask layer M1 and the hardmask layer HM. A metal layer may be formed to fill openings of the patterned target layer TG. For example, the metal layer may be deposited over the target layer TG including being in the openings of target layer TG, and a chemical mechanical polishing (CMP) process may be performed to planarized the resulting structure until the metal on the upper surface of the target layer TG is removed, leaving discrete metal patterns in the openings of the target layer TG.

The patterned metal layer may include first metal patterns MT1 and second metal patterns MT2. The first and second metal patterns MT1 and MT2 may include copper (Cu) or tungsten (W). The first metal patterns MT1 may correspond to and be defined by the first layout patterns LP1 of FIG. 1, and the second metal patterns MT2 may correspond to and be defined by the second layout patterns LP2 of FIG. 1.

The first metal patterns MT1 may include a first metal line ML1 and a second metal line ML2. The first and second metal lines ML1 and ML2 may extend in a second direction D2. The first and second metal lines ML1 and ML2 may extend in parallel to each other.

The first metal line ML1 may include a first segment ML11 and a second segment ML12. The first segment ML11 may extend in the second direction D2. The second segment ML12 may be positioned at an end of the first metal line ML1. The second segment ML12 may have a width in a first direction D1 that decreases with increasing distance in the second direction D2 from the first segment ML11.

The second metal line ML2 may include a third segment ML21 and a fourth segment ML22. The third segment ML21 may extend in the second direction D2. The fourth segment ML22 may be positioned at an end of the second metal line ML2. The fourth segment ML22 may have a width in the first direction D1 that decreases with increasing distance in the second direction D2 from the third segment ML21.

The second metal pattern MT2 may include a third metal line ML3. The third metal line ML3 may extend in the second direction D2. The third metal line ML3 may extend in parallel to the first and second metal lines ML1 and ML2. The third metal line ML3 may be adjacent in the first direction D1 to the first metal line ML1. The third metal line ML3 may be adjacent in the first direction D1 to the second metal line ML2. The third metal line ML3 may lie between the first and second metal lines ML1 and ML2.

The third metal line ML3 may include a fifth segment ML31 and a sixth segment ML32. The fifth segment ML31 may extend in the second direction D2, and may be adjacent both to the first segment ML11 of the first metal line ML1 and to the third segment ML21 of the second metal line ML2. The sixth segment ML32 may be adjacent both to the second segment ML12 of the first metal line ML1 and to the fourth segment ML22 of the second metal line ML2. The sixth segment ML32 may have a width in the first direction D1 that increases with increasing distance in the second direction D2 from the fifth segment ML31.

For example, the first segment ML11 of the first metal line ML1, the third segment ML21 of the second metal line ML2, and the fifth segment ML31 of the third metal line ML3 may have substantially the same width in the first direction D1.

The first metal line ML1 and the third metal line ML3 may have a first pitch P1 therebetween. The second metal line ML2 and the third metal line ML3 may have a second pitch P2 therebetween. For example, the first pitch P1 and the second pitch P2 may be substantially the same.

A minimum distance between the first segment ML11 of the first metal line ML1 and the fifth segment ML31 of the third metal line ML3 may be substantially the same as a minimum distance between the second segment ML12 of the first metal line ML1 and the sixth segment ML32 of the third metal line ML3. A minimum distance between the third segment ML21 of the second metal line ML2 and the fifth segment ML31 of the third metal line ML3 may be substantially the same as a minimum distance between the fourth segment ML22 of the second metal line ML2 and the sixth segment ML32 of the third metal line ML3.

In some examples, an alternating sequence of first metal patterns MT1 and second metal patterns MT2 may be formed, comprising a series of first metal lines (formed of corresponding first metal patterns MT1) and second metal lines (formed of corresponding second metal patterns MT2) extending in parallel (e.g., in the second direction D2). Each neighboring pair of first metal lines may have one second metal line interposed therebetween, and each neighboring pair of second metal lines may have one first metal line interposed therebetween. The pitch between this group metal lines (the group of first metal lines and second metal lines) being substantially the same. With respect to a line extending in the first direction D1 (such as with respect to the line A-A' corresponding to the cross section of FIG. 6B), widths of the first metal lines may be the substantially the same and widths of the second metal lines may be substantially the same, which may be the same or different than (e.g., greater than) the widths of the first metal lines. Distances between immediately neighboring metal lines of this group of metal lines may be substantially the same. FIG. 6B illustrates an example of this configuration, with respect to the four metal lines (including ML1, ML2, ML3 and a metal line formed of above ML1 in FIG. 6A along the A'A' cross section) disposed between the leftmost first metal pattern MT1 and the rightmost second metal pattern MT2. It will be appreciated, however, more than four metal lines may be formed in this configuration.

Figure 7:
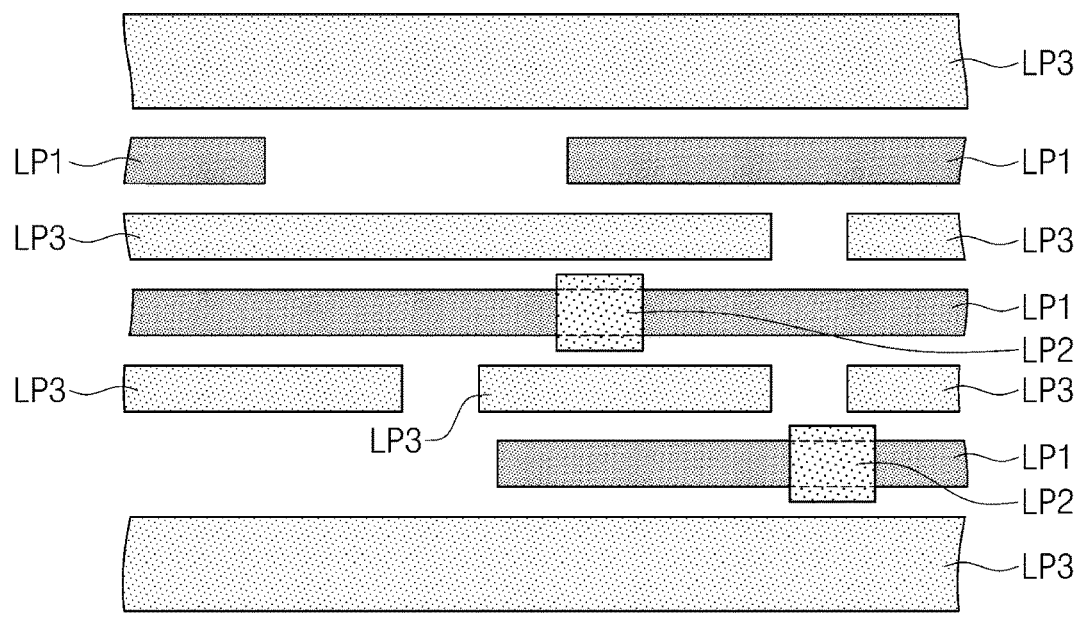
FIG. 7 illustrates a plan view showing a layout defining a metal layer of a semiconductor device, according to exemplary embodiments of inventive concepts.
Figure 7:
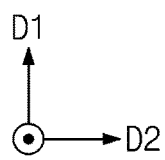

FIG. 7 illustrates a plan view showing a layout defining a metal layer of a semiconductor device, according to exemplary embodiments of inventive concepts.

Referring to FIG. 7, layout patterns LP1, LP2, and LP3 may be provided. The layout patterns LP1, LP2 and LP3 may correspond to an ideal design of a layer of a semiconductor device. The layout patterns LP1, LP2, and LP3 may include first layout patterns LP1, second layout patterns LP2, and third layout patterns LP3. The second layout patterns LP2 may overlap the first layout patterns LP1.

A first photomask may be derived from and fabricated based on the first layout patterns LP1, a second photomask may be derived from and fabricated based on the second layout patterns LP2, and a third photomask may be derived from and fabricated based on the third layout patterns LP3. For example, the layout shown in FIG. 7 may be used to derive and separately fabricate a total of three photomasks. The first to third photomasks may be used to form patterns within a layer of a semiconductor device.

FIGS. 8A to 23A illustrate plan views showing a method of manufacturing a semiconductor device, according to exemplary embodiments of inventive concepts. FIGS. 8B to 23B illustrate cross-sectional views taken along line A-A' of FIGS. 8A to 23A, respectively. FIGS. 8C to 23C illustrate cross-sectional views taken along line B-B' of FIGS. 8A to 23A, respectively. FIG. 20D illustrates an enlarged view showing section A of FIG. 20C.

Figure 8A:
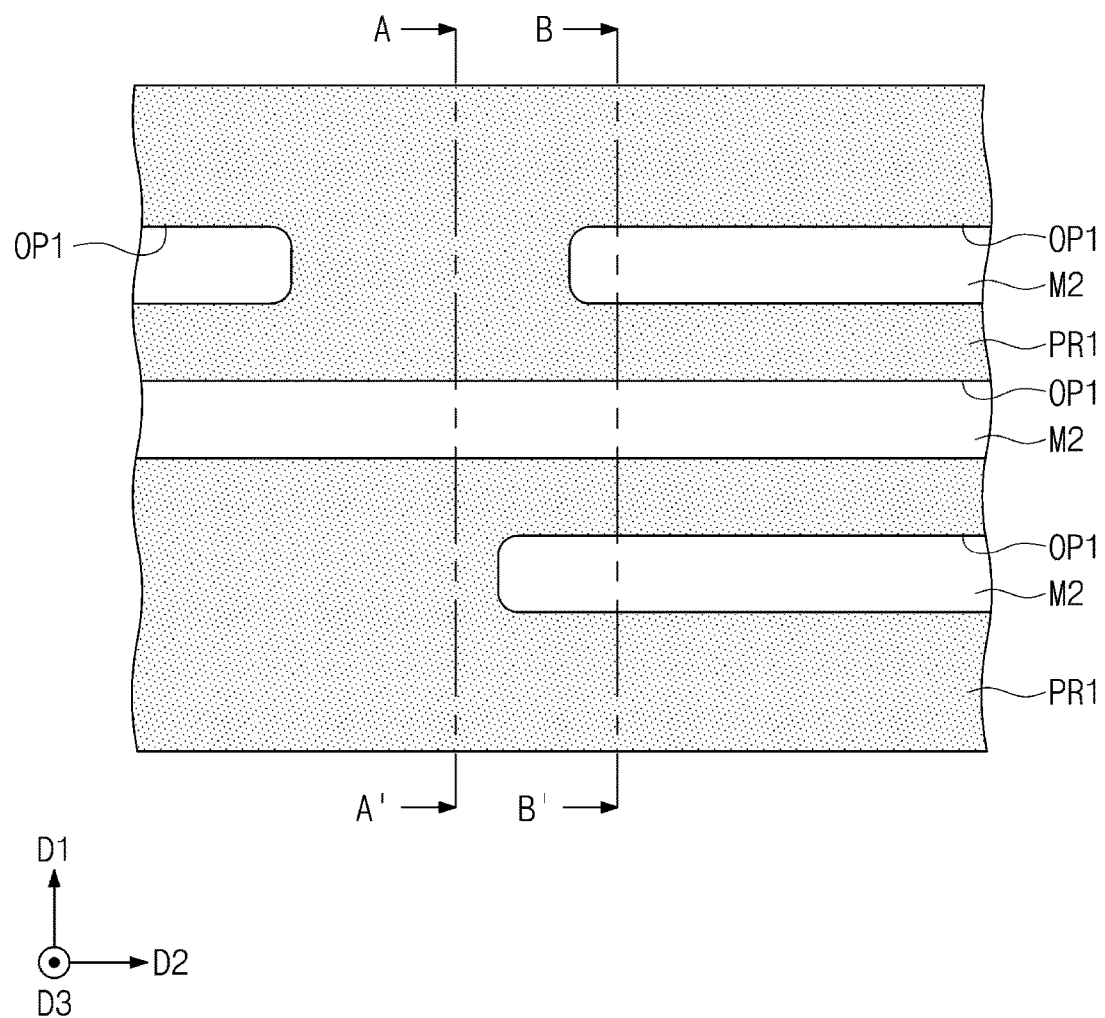
Figure 8B:
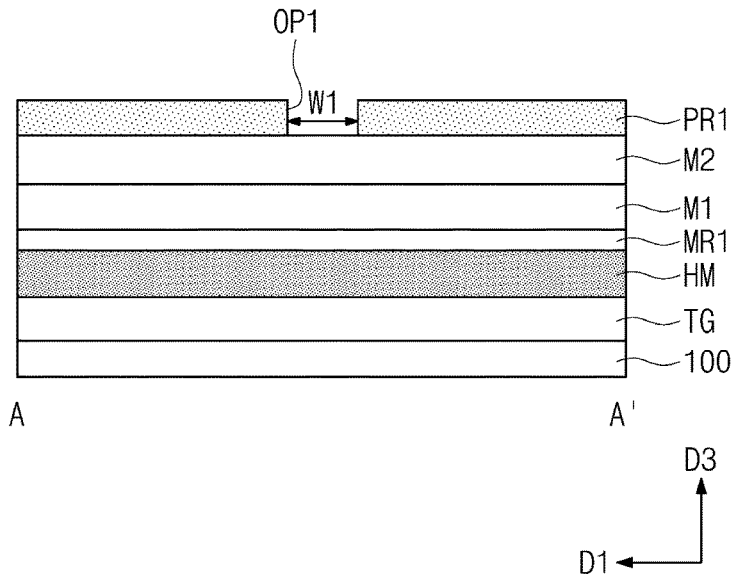
Figure 8C:
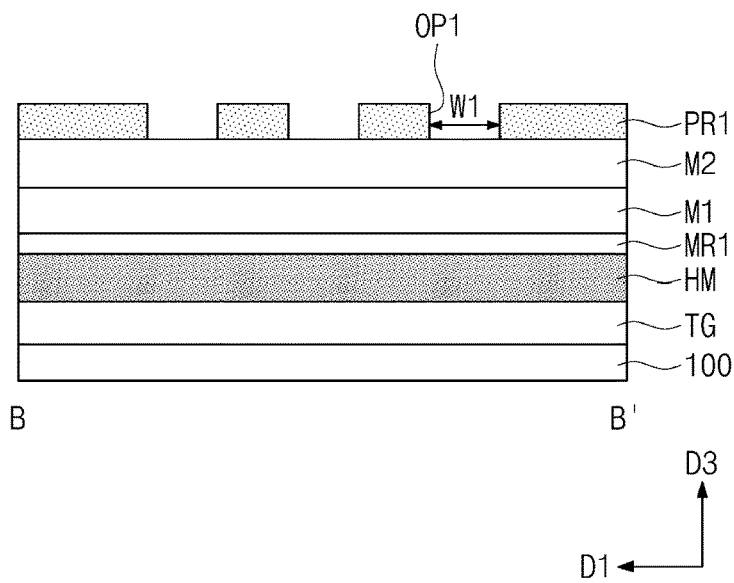

Referring to FIGS. 8A to 8C, a target layer TG, a hardmask layer HM, a first memory layer MR1, a first mask layer M1, and a second mask layer M2 may be sequentially formed on a substrate 100. The substrate 100 may be or include a crystalline semiconductor substrate. For example, the substrate 100 may be one of a silicon substrate, a germanium substrate, a silicon-germanium substrate, and a compound semiconductor substrate. The target layer TG may be, for example, an insulating layer, such as silicon nitride (SiN) or silicon oxide ($SiO_2$) or may be a conductive layer (e.g., doped polysilicon). The hardmask layer HM may be formed of, for example, titanium nitride (TiN). The first memory layer MR1 may be formed of, for example, silicon oxide. The first mask layer M1 may formed of, for example, one or more of an amorphous silicon layer, a spin-on-hardmask (SOH) layer, a spin-on-glass (SOG) layer, a silicon nitride (SiN) layer, a silicon oxycarbonitride (SiOCN) layer, a silicon carbonitride (SiCN) layer, and a tin oxide (SnOx) layer. The second mask layer M2 may include, for example, one or more of a silicon-containing antireflection coating (SiARC) layer, a spin-on-hardmask (SOH) layer, and an amorphous carbon layer.

A first photoresist pattern PR1 having first openings OP1 may be formed on the second mask layer M2. For example, the formation of the first photoresist pattern PR1 may include forming a first photoresist layer on the second mask layer M2, and then using the first photomask referenced with respect to FIG. 7 as a photomask to perform conventional exposure and development processes on the first photoresist layer. Each of the first openings OP1 of the first photoresist pattern PR1 may have a first width W1 in a first direction D1. The first layout patterns LP1 of FIG. 7 may correspond to the first openings OP1.

Figure 9A:
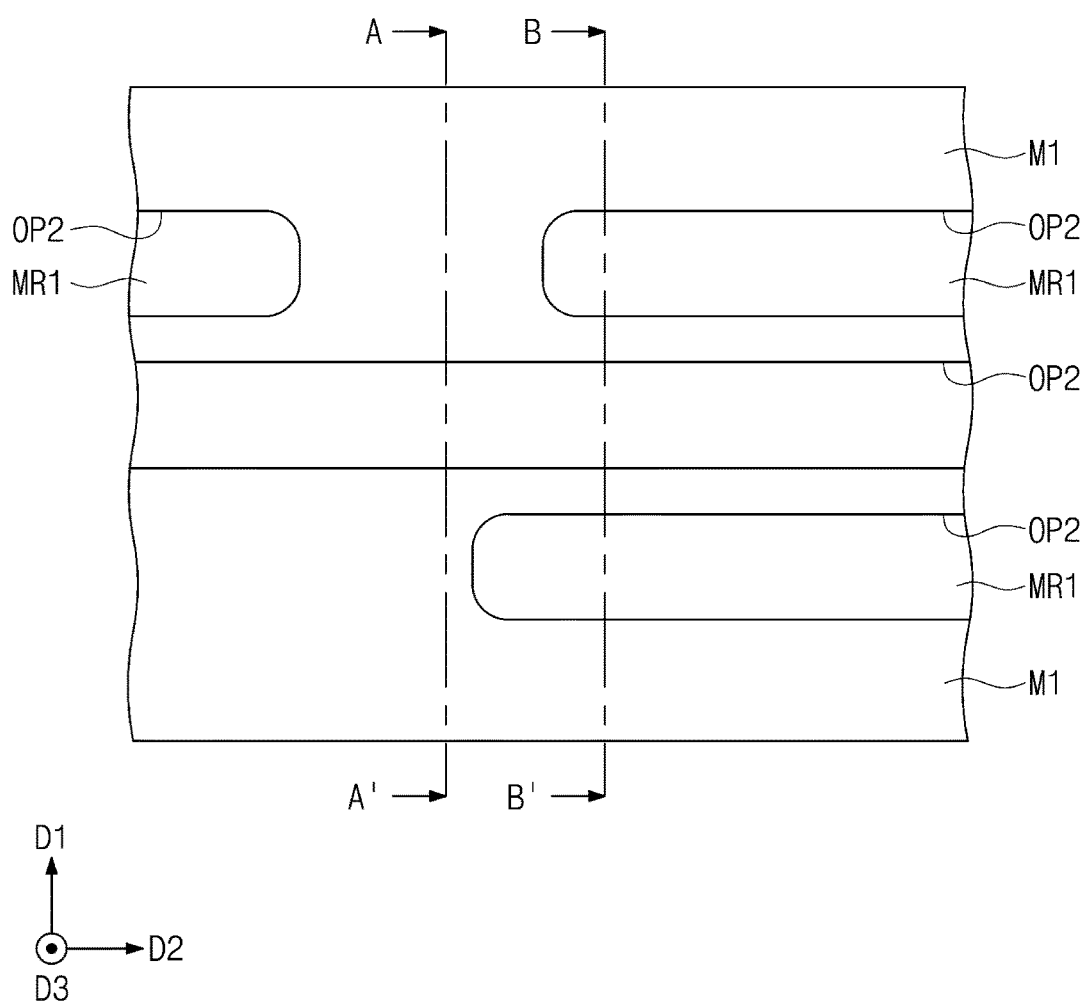
Figure 9B:
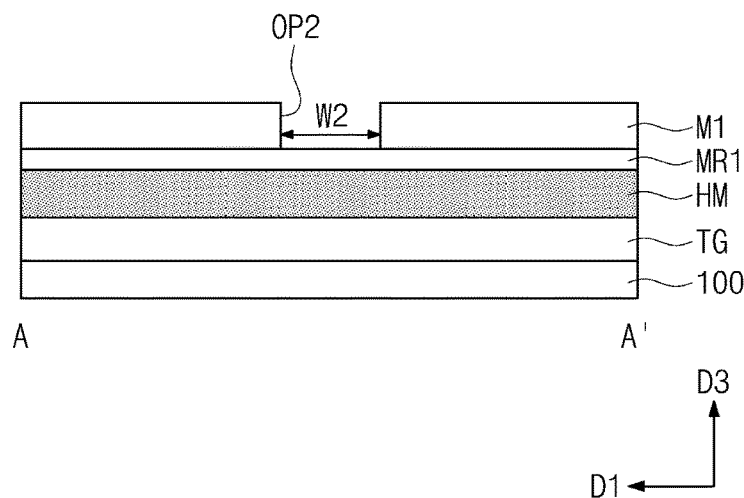
Figure 9C:
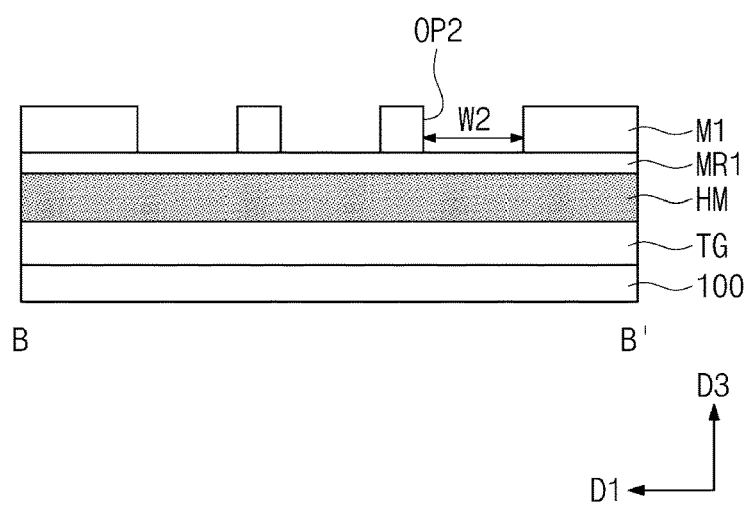

Referring to FIGS. 9A to 9C, a first patterning process may be performed using the first photoresist pattern PR1 as a mask. Second openings OP2 may thus be formed in the first mask layer M1. For example, the performing of the first patterning process may include using the first photoresist pattern PR1 as a mask to pattern the second mask layer M2, and then using the patterned second mask layer M2 as a mask to pattern the first mask layer M1. After the first patterning process, remaining portions of the second mask layer M2 may be removed.

Each of the second openings OP2 of the patterned first mask layer M1 may have a second width W2 in the first direction D1. After the remaining second mask layer M2 is removed, a pull-back process may be performed on the patterned first mask layer M1. The pull-back process may include a dry etching process or a wet etching process. The pull-back process may etch into sidewalls of the initially patterned first mask layer M1. For example, openings may be initially formed in the first mask layer M1 by performing an anisotropic etch using the first photoresist pattern PR1 as a mask to pattern the second mask layer M2, and then performing an anisotropic etch using the patterned second mask layer M2 as a mask to pattern the first mask layer M1. These openings initially formed in the first mask layer M1 may then be expanded by the pull-back process by etching sidewalls (e.g., in D1 and D2 directions) of the first mask layer M1 that define these initially formed openings. As a result, when viewed in plan, each of the second openings OP2 may have a size greater than that of each of the first openings OP1. For example, the second width W2 of each of the second openings OP2 may be greater than the first width W1 of the first opening OP1 that vertically overlaps a corresponding one of the second openings OP2.

Although not shown, a protective layer may further be formed on the first mask layer M1. The protective layer may cover a top surface of the first mask layer M1. The protective layer may prevent the top surface of the first mask layer M1 from being etched when sidewalls of the first mask layer M1 are etched during the pull-back process.

Figure 10A:
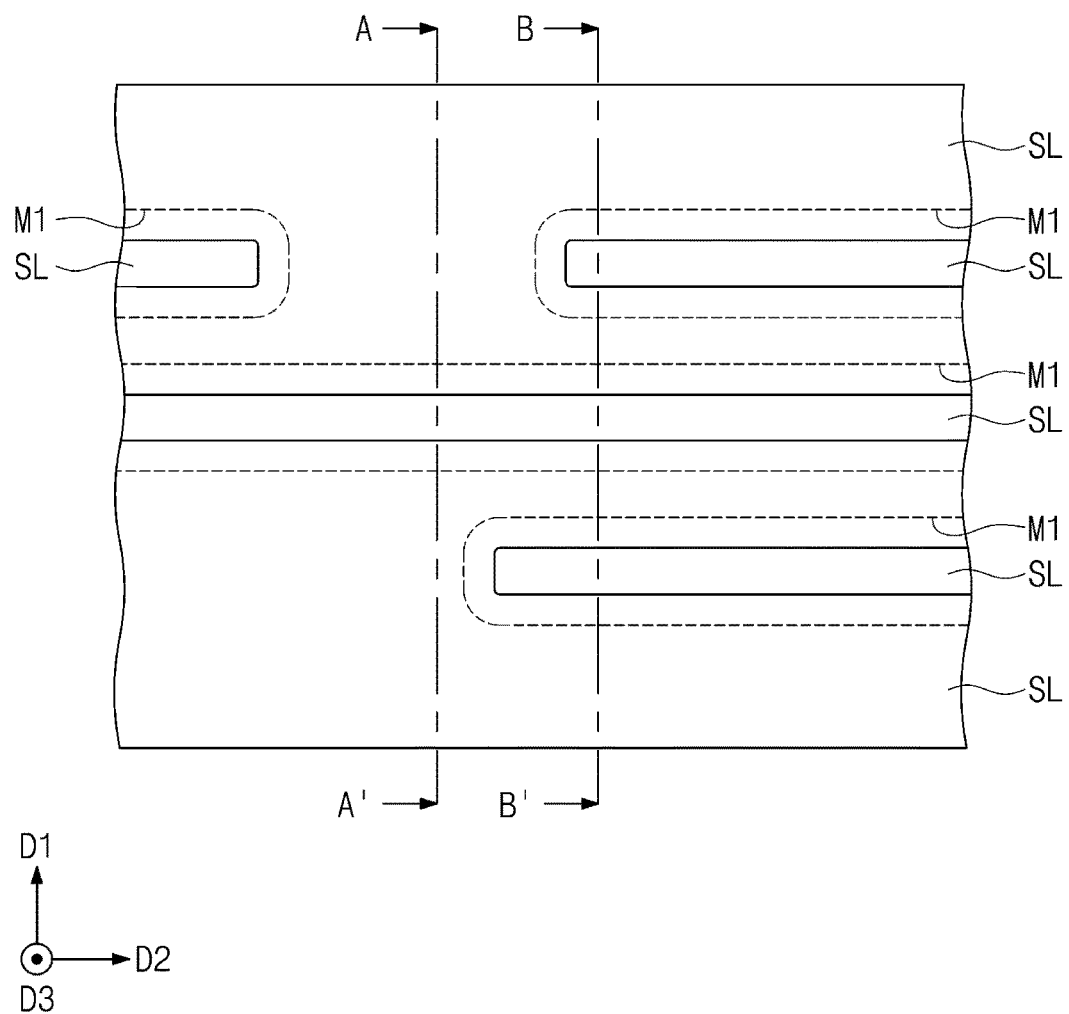
Figure 10B:
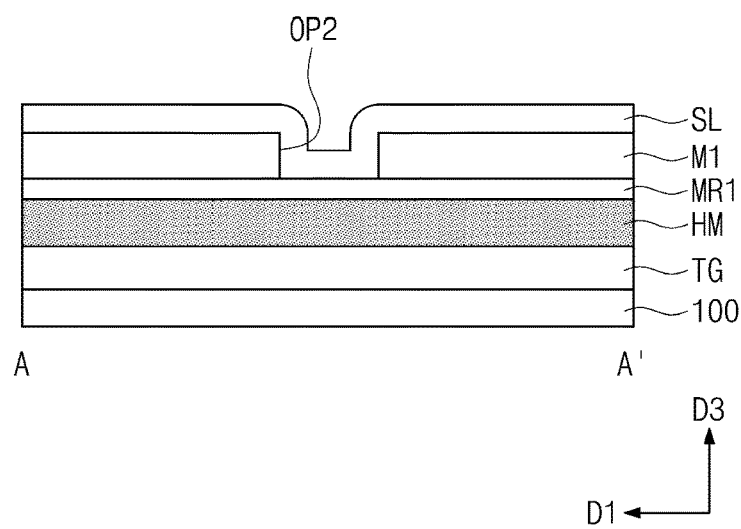
Figure 10C:
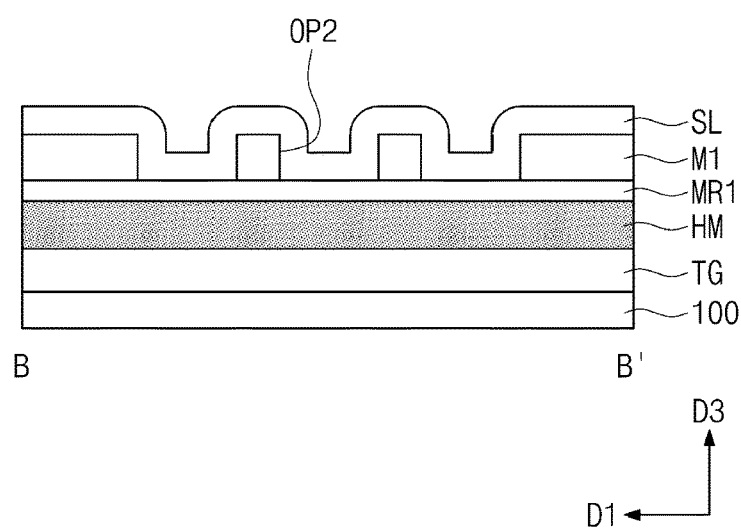

Referring to FIGS. 10A to 10C, a spacer layer SL may be conformally formed on an entire surface of the substrate 100. The spacer layer SL may include a material that can be anisotropically etched. The spacer layer SL may include, for example, one or more of titanium oxide (TiOx), silicon oxide (SiOx), silicon nitride (SiN), silicon oxynitride (SiON), aluminum oxide (AlOx), and tin oxide (SnOx). For example, atomic layer deposition (ALD) may be used to form the spacer layer SL. The spacer layer SL may partially fill each of the second openings OP2 of the first mask layer M1.

Figure 11A:
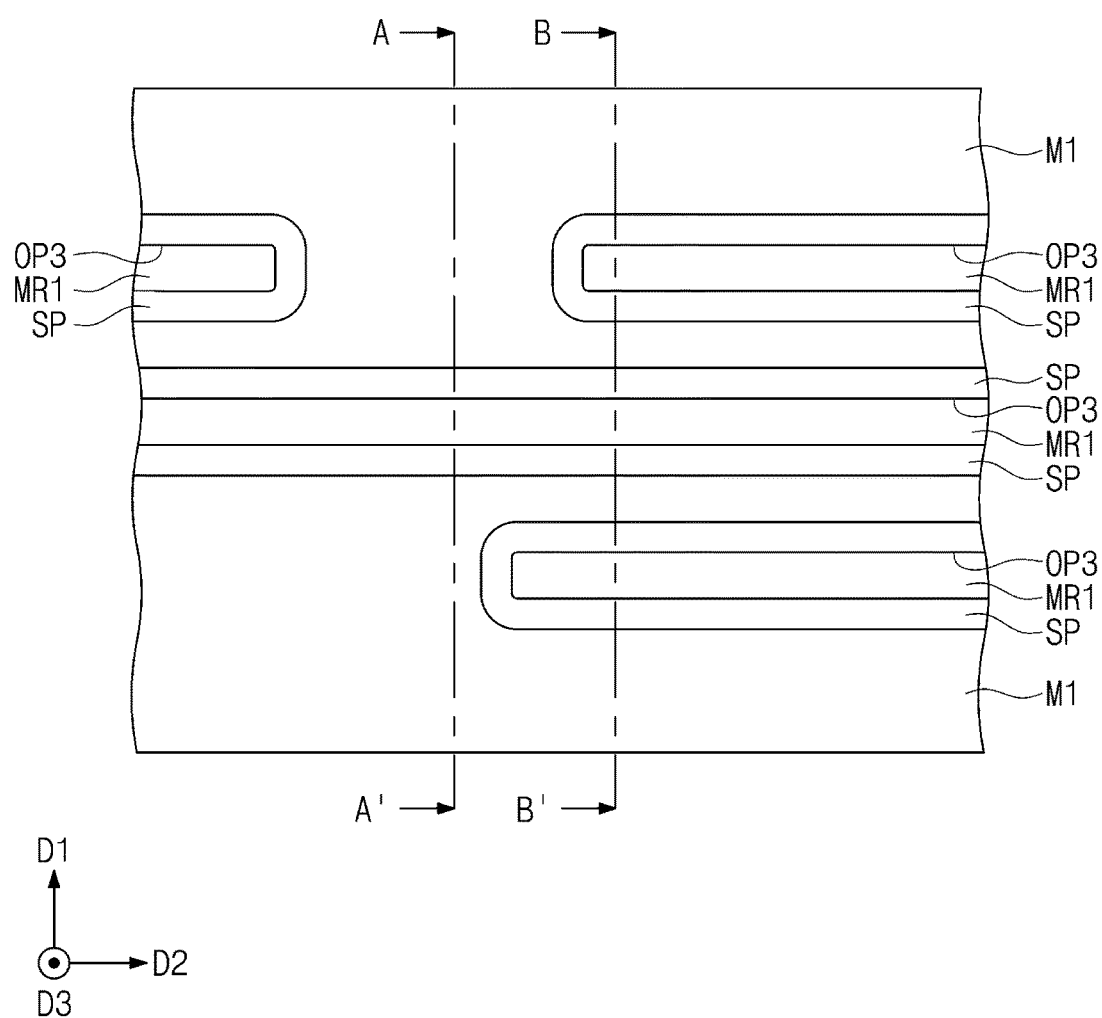
Figure 11B:
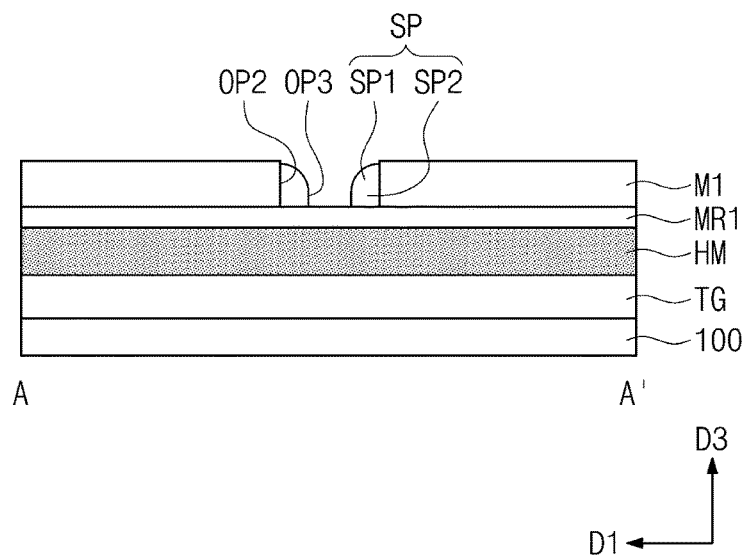
Figure 11C:
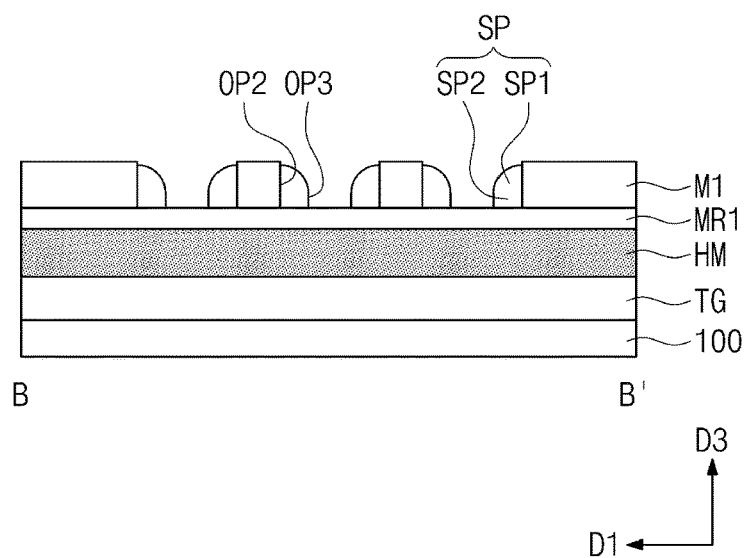

Referring to FIGS. 11A to 11C, a first etching process may be performed on the spacer layer SL to remove a portion of the spacer layer SL. The first etching process on the spacer layer SL may be an anisotropic etching process. When the spacer layer SL is partially removed, spacers SP may be formed on the sidewalls of the first mask layer M1. The spacers SP may be formed in the second openings OP2 of the first mask layer M1 and define third openings OP3. With respect to a plan view (e.g., FIG. 11A), the third opening OP3 may be surrounded by a corresponding spacer SP. Each of the third openings OP3 may be formed within (and overlap) a corresponding one of the second openings OP2. Each of the third openings OP3 may be smaller than a corresponding one of the second openings OP2 based on the width of the spacer SP formed on sidewalls of the corresponding second opening OP2. The third opening OP3 may partially expose a top surface of the first memory layer MR1.

Each of the spacers SP may include a first part SP1 and a second part SP2. With respect to the cross sectional views of FIGS. 11B and 11C, the first part SP1 of the spacer SP may have a width in the first direction D1 that increases toward a bottom thereof from a top thereof. For example, the first part SP1 of the spacer SP may have a curved top surface. The second part SP2 of the spacer SP may have a substantially uniform width in the first direction D1.

Figure 12A:
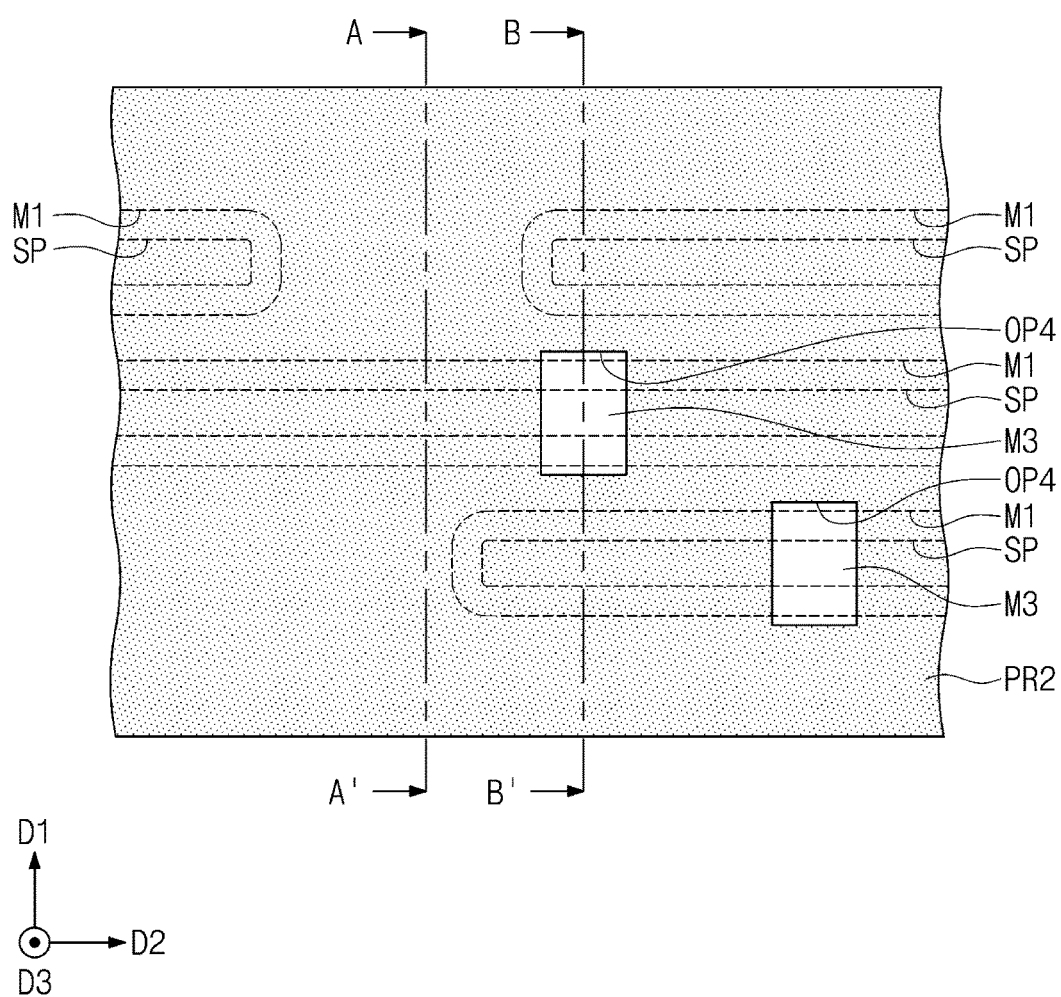
Figure 12B:
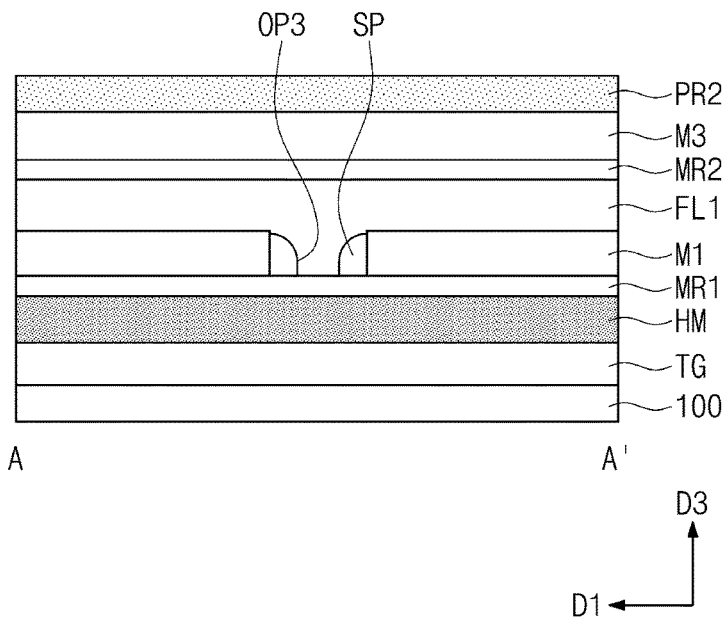
Figure 12C:
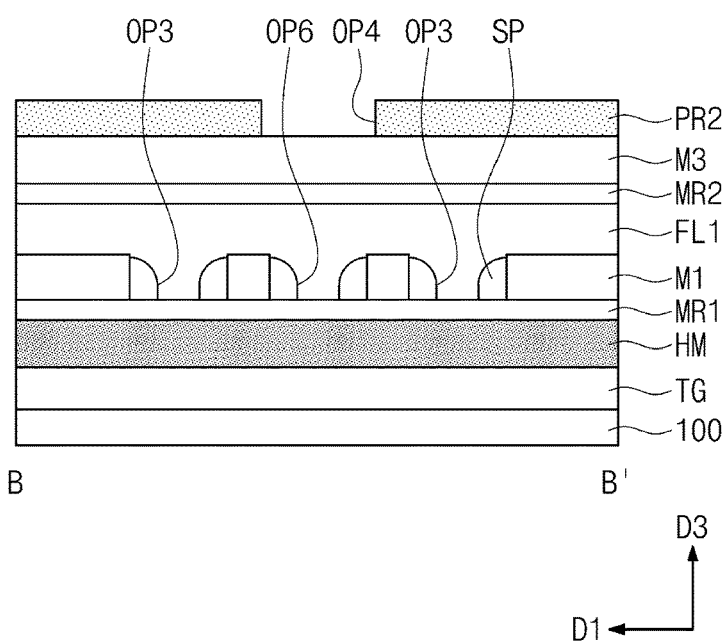

Referring to FIGS. 12A to 12C, a first filling layer FL1, a second memory layer MR2, and a third mask layer M3 may be sequentially formed on the entire surface of the substrate 100. The first filling layer FL1 may fill the third openings OP3. The first filling layer FL1 may be, for example, a spin-on-hardmask (SOH) layer. The second memory layer MR2 may be, for example, silicon oxide. The third mask layer M3 may be formed of, for example, one or more of a silicon-containing antireflection coating (SiARC) layer, a spin-on-hardmask (SOH) layer, and an amorphous carbon layer.

A second photoresist pattern PR2 having fourth openings OP4 may be formed on the third mask layer M3. For example, the formation of the second photoresist pattern PR2 may include forming a second photoresist layer on the third mask layer M3, and then using the second photomask of FIG. 7 as a photomask to perform exposure and development processes on the second photoresist layer. The second layout patterns LP2 of FIG. 7 may correspond to the fourth openings OP4. The fourth openings OP4 may vertically overlap portions of the third openings OP3. Portions of third openings OP3 that are directly below a fourth opening OP3 are referenced herein as sixth openings OP6 (see FIG. 12C).

Figure 13A:
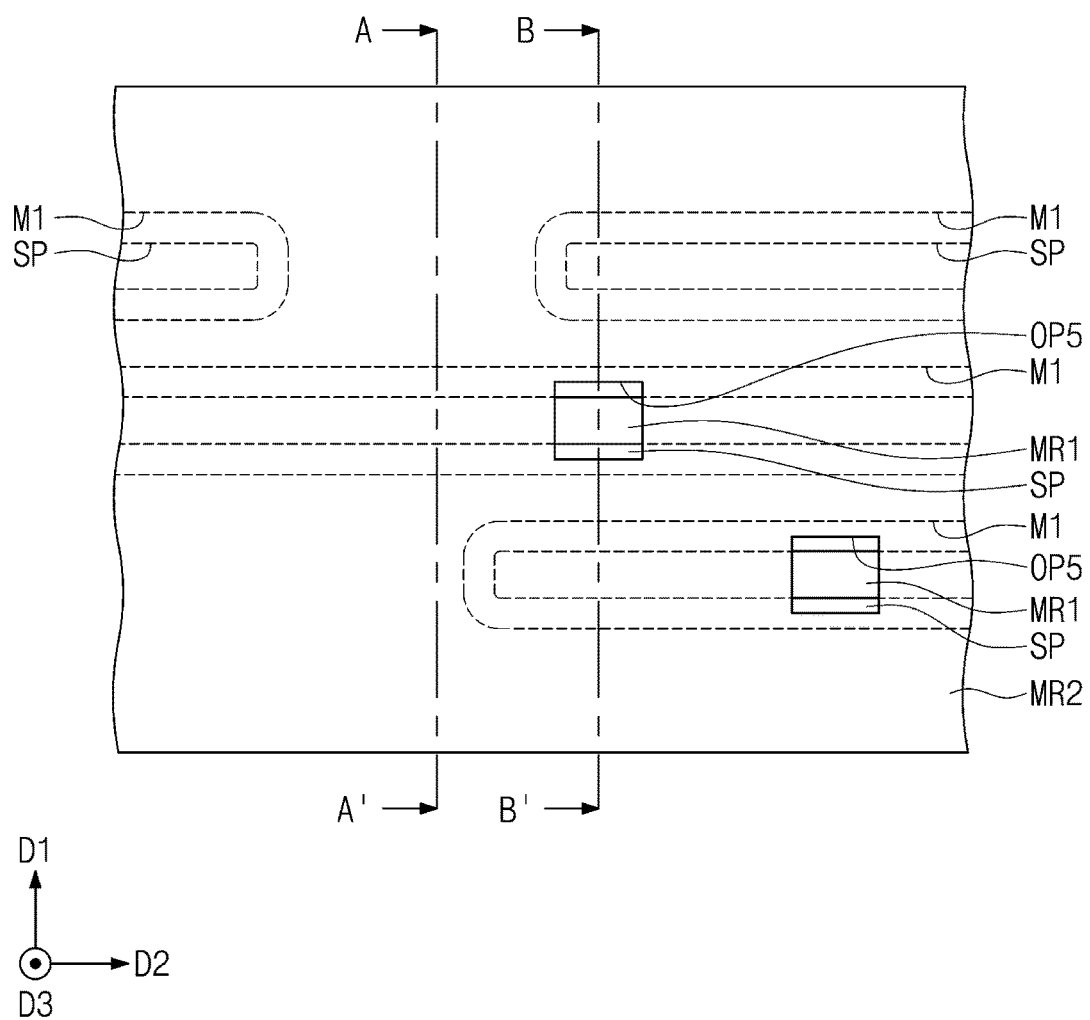
Figure 13B:
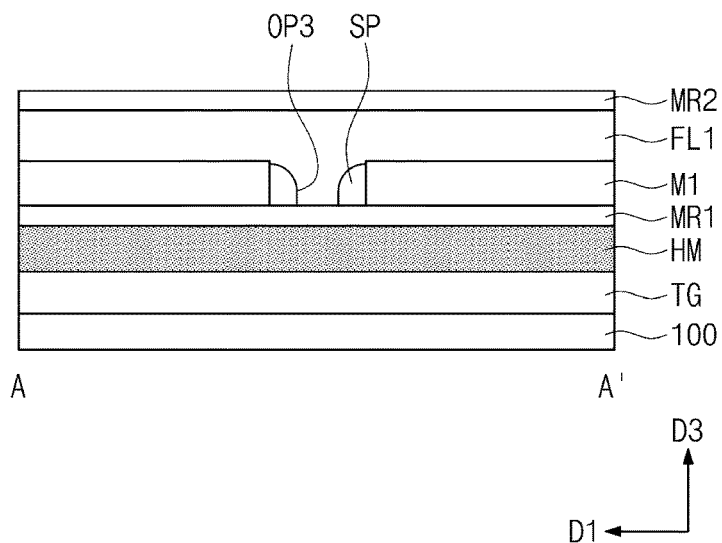
Figure 13C:
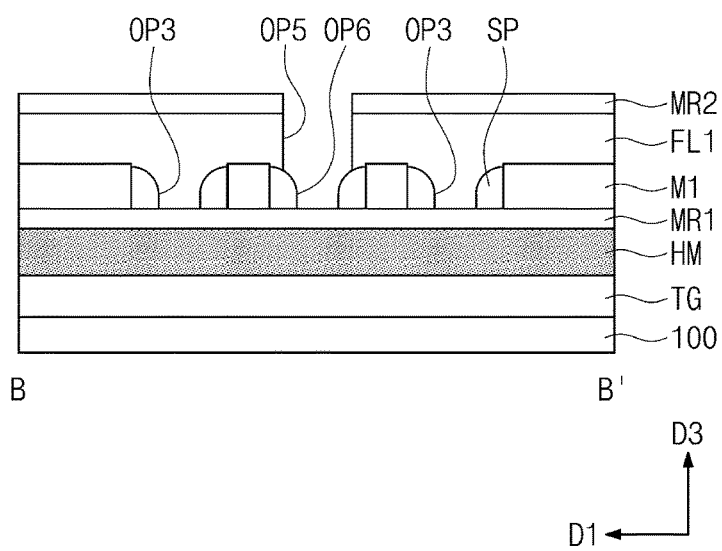

Referring to FIGS. 13A to 13C, a second patterning process may be performed using the second photoresist pattern PR2 as a mask. For example, performing of the second patterning process may include using the second photoresist pattern PR2 as a mask to pattern the third mask layer M3 with an anisotropic etch, using the patterned third mask layer M3 as a mask to pattern the second memory layer MR2 with an anisotropic etch, and then using the patterned second memory layer MR2 as a mask to pattern the first filling layer FL1 with an anisotropic etch. The second patterning process may expose portions of the first memory layer MR1 via the formation of the sixth openings OP6. Remaining portions of the second photoresist pattern PR2 and the third mask layer M3 may be removed after the second patterning process.

The first filling layer FL1 may be patterned to form fifth openings OP5. Each of the fifth openings OP5 of the first filling layer FL1 may have a width in the first direction D1 less than a width in the first direction D1 of the fourth opening OP4 vertically overlapping a corresponding one of the fifth openings OP5. This may result from a gradual reduction in patterned widths when the third mask layer M3, the second memory layer MR2, and the first filling layer FL1 are patterned during the second patterning process (e.g., a hole etched below a fourth opening OP4 in the third mask layer M3, the second memory layer MR2, and the first filling layer FL1 using the second photoresist pattern PR2 as a mask may narrow from top to bottom).

The first filling layer FL1 may be removed to form the fifth openings OP5 and the sixth openings OP6.

Figure 14A:
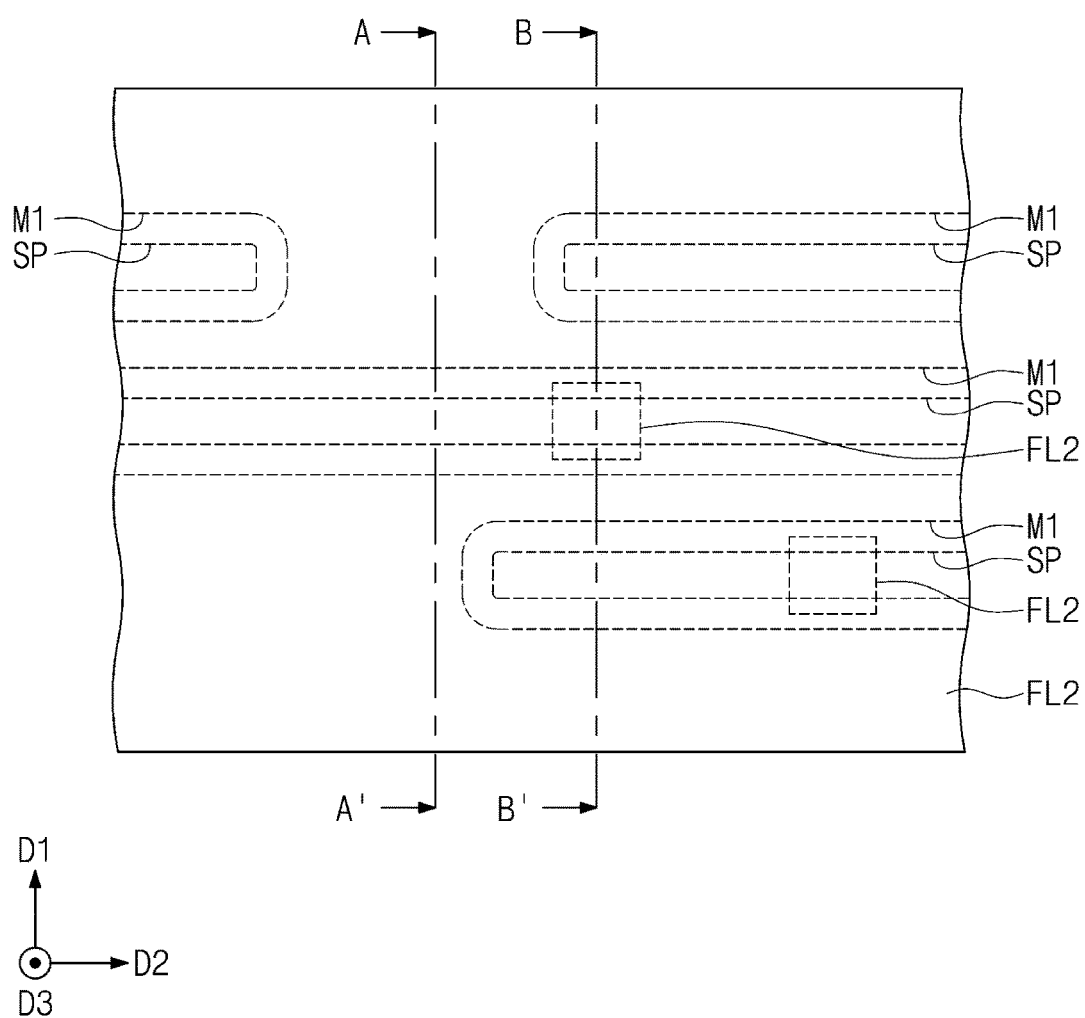
Figure 14B:
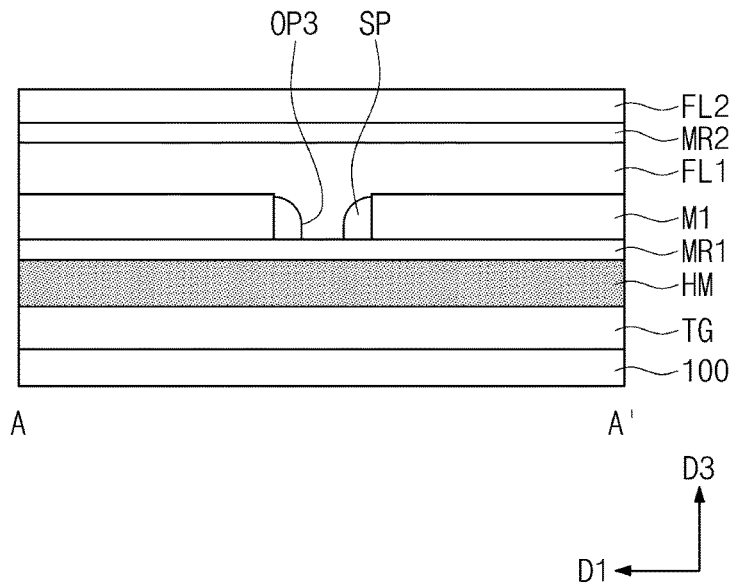
Figure 14C:
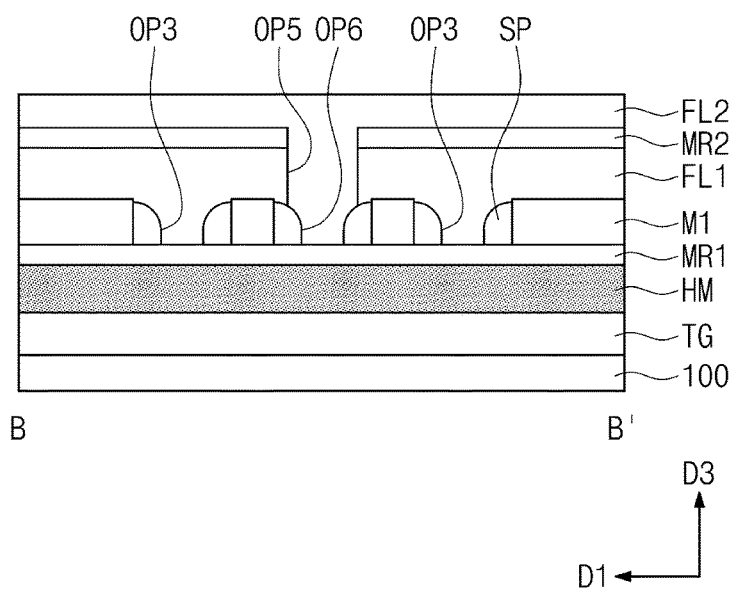

Referring to FIGS. 14A to 14C, a second filling layer FL2 may be formed on the entire surface of the substrate 100. The second filling layer FL2 may refill the fifth and sixth openings OP5 and OP6 opened with respect to the first filling layer FL1.

The second filling layer FL2 may include the same material as that of the spacer SP. The second filling layer FL2 and the spacer SP may be formed of, for example, titanium oxide (TiOx). Alternatively, the second filling layer FL2 may be formed of a different material from that of the spacer SP. The second filling layer FL2 and the first memory layer MR1 may be formed of the same material, for example, silicon oxide or amorphous silicon.

The second filling layer FL2 may be formed by, for example, atomic layer deposition (ALD), chemical vapor deposition (CVD), or spin coating.

Figure 15A:
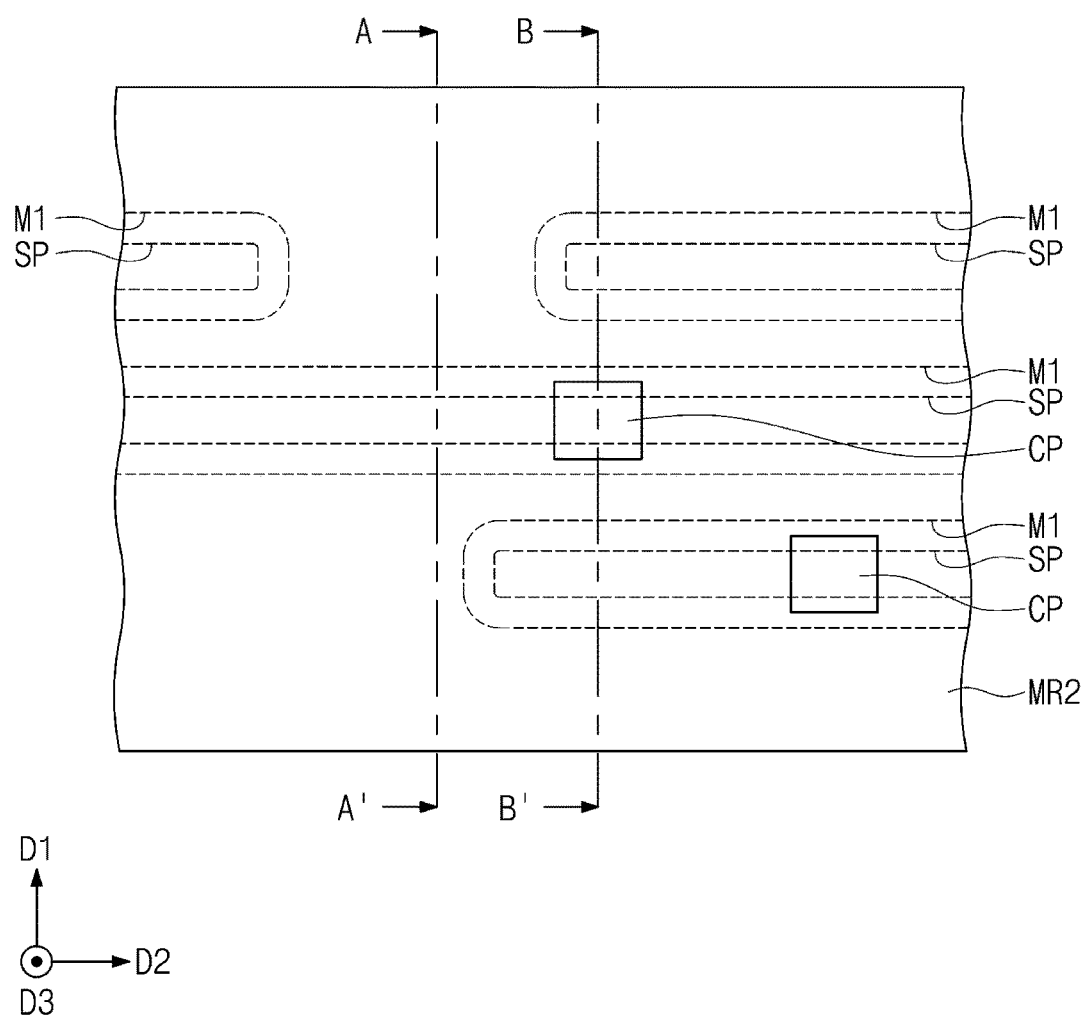
Figure 15B:
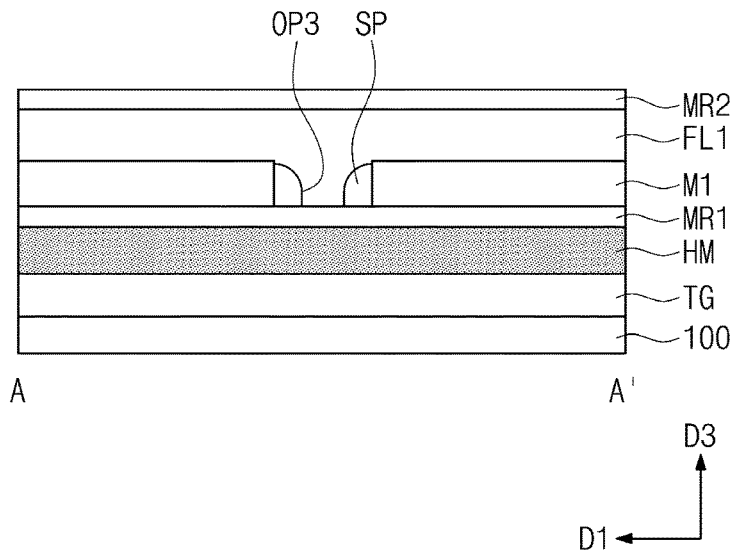
Figure 15C:
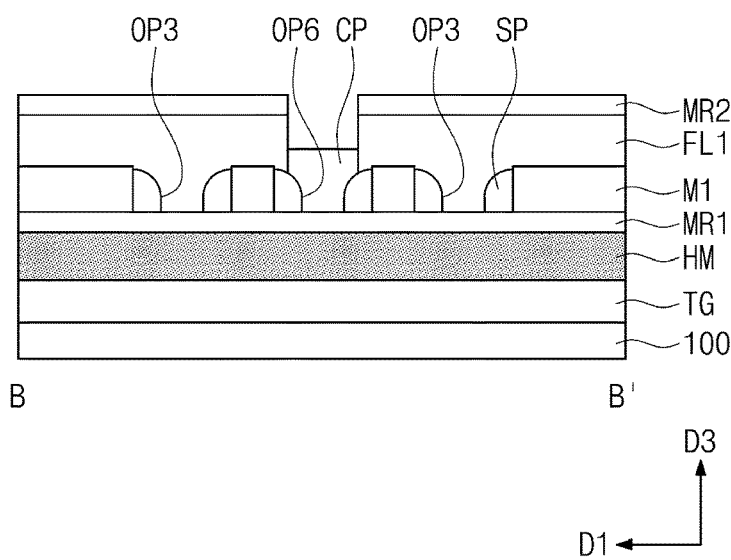

Referring to FIGS. 15A to 15C, a planarization process may be performed to remove a portion of the second filling layer FL2. The planarization process may include a chemical mechanical polishing (CMP) process and/or an etch-back process. For example, a CMP process may be performed to remove the second filling layer FL2 until the top surface of the second memory layer MR2 is exposed. The structure resulting after this CMP process may include a discrete portion of the second filling layer FL2 positioned within the second opening OP2 with respect to a plan view (see FIGS. 15A and 10A) filling a fifth opening OP5 and a sixth opening OP6. Then, an etch-back process may be performed to reduce the height of this discrete portion of the second filling layer FL2 formed in the fifth opening OP5 and sixth opening OP6. A cut pattern CP may thus be formed. The cut pattern CP may be formed by a remaining portion of the second filling layer FL2 formed within the fifth opening OP5 and sixth opening OP6. The cut pattern CP may have a top surface lower than that of the first filling layer FL1. The cut pattern CP may completely fill the sixth opening OP6. The cut pattern CP may have a top surface higher than and cover the spacer SP that defines the sixth opening OP6 in which it is formed. In some examples, an etch-back process may be performed to remove an upper portion of the second filling layer FL2 above the top surface of the second memory layer MR2 and to reduce the height of a discrete portion of the second filling layer FL2 formed in the fifth opening OP5 and sixth opening OP6.

Figure 16A:
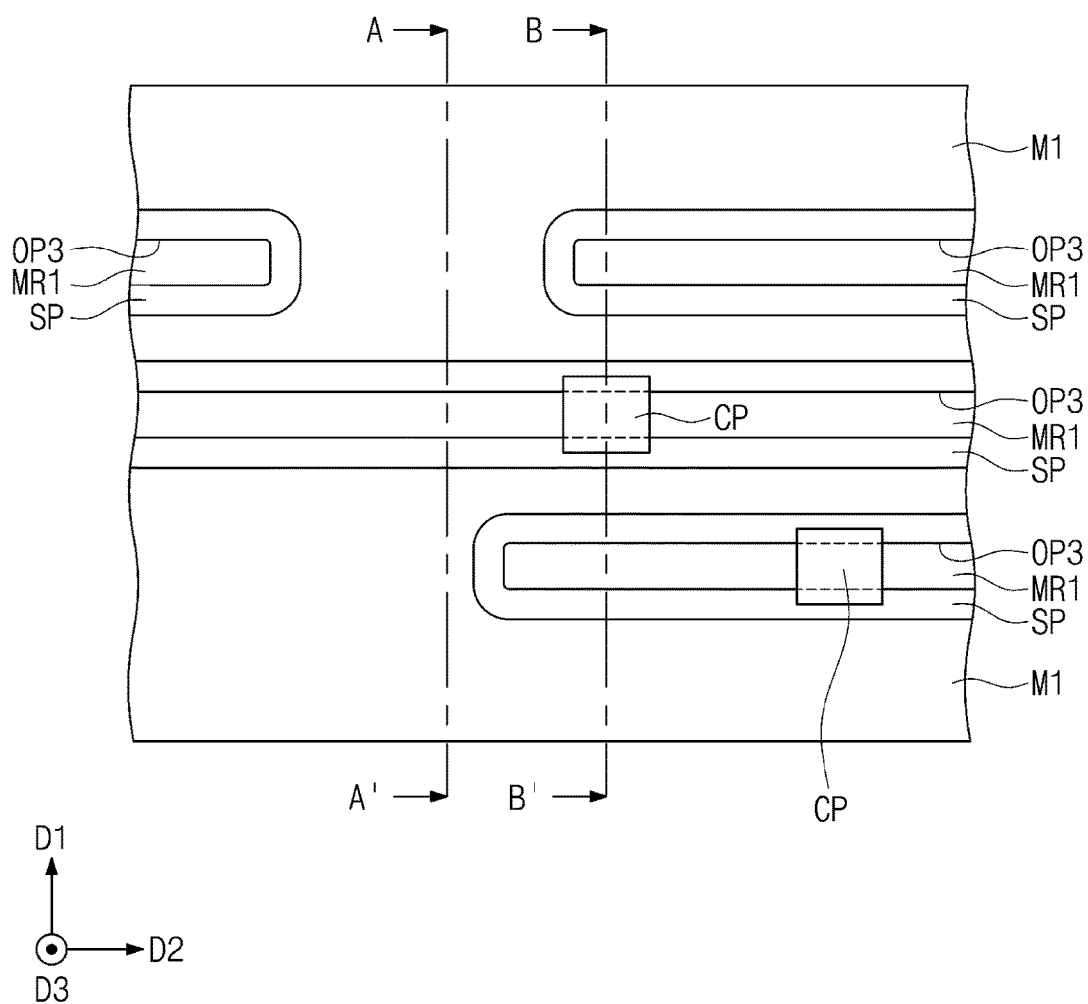
Figure 16B:
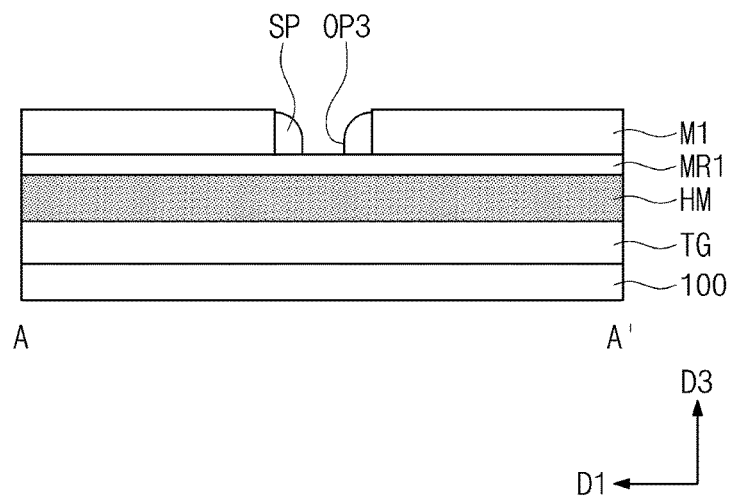
Figure 16C:
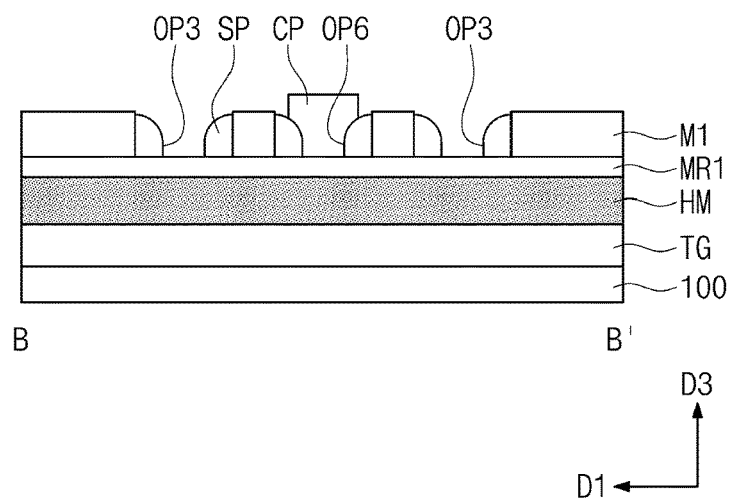

Referring to FIGS. 16A to 16C, a second etching process may be performed to remove the second memory layer MR2 and the first filling layer FL1. The first filling layer FL1 may thus be removed from the third openings OP3. For example, the third openings OP3 may be opened again. Since each of the sixth openings OP6 is filled with the cut pattern CP, the sixth openings OP6 may not be opened.

In some embodiments, when the cut pattern CP and the first mask layer M1 are formed of the same material (e.g., amorphous silicon), the cut pattern CP may be partially etched after the second etching process described with respect to FIGS. 16A to 16C. For example, during this second etching process, the cut pattern CP may have its opposite sidewalls that are exposed to the third opening OP3 etched. Thus, after this second etching process, the cut pattern CP may thus have a reduced width in the second direction D2.

Figure 17A:
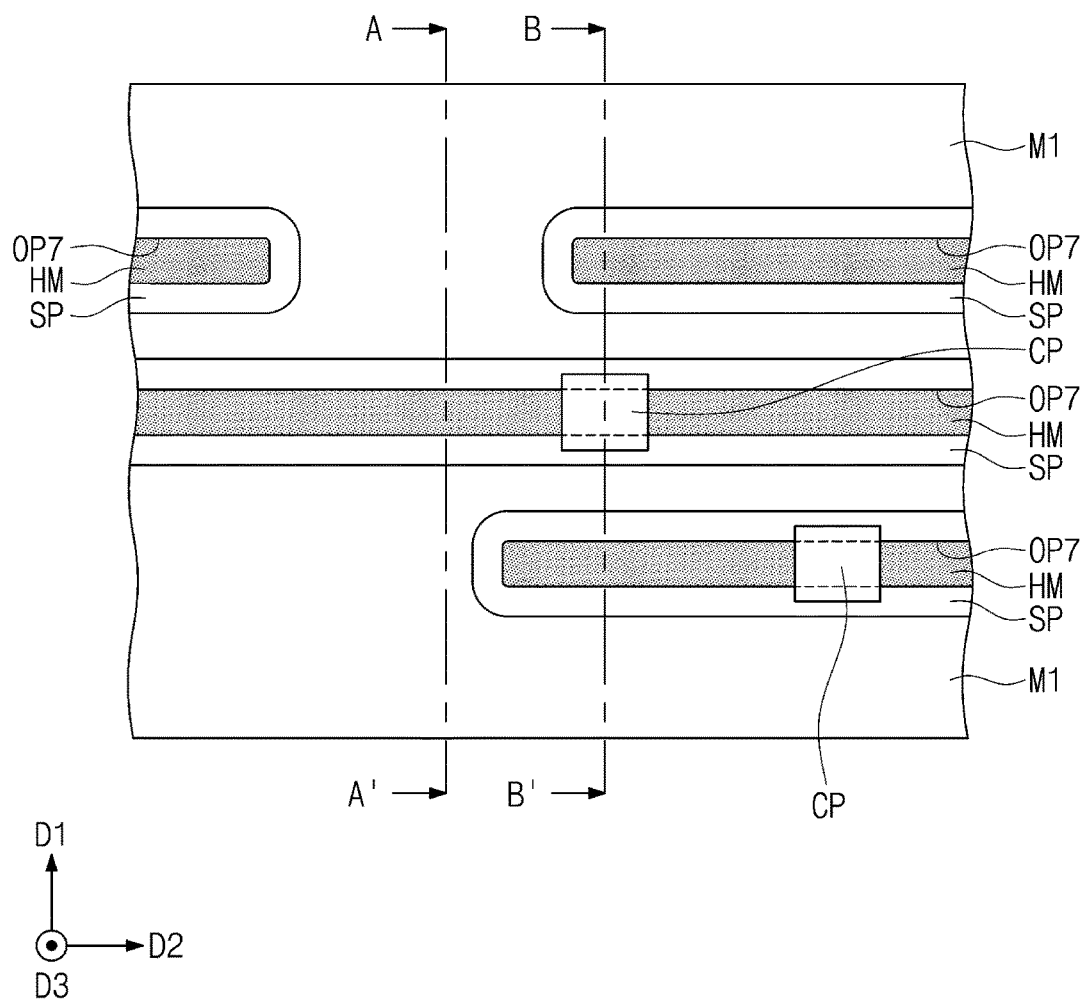
Figure 17B:
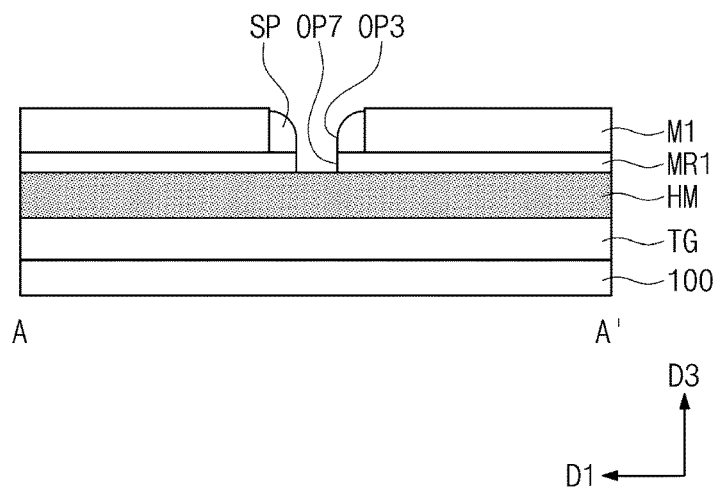
Figure 17C:
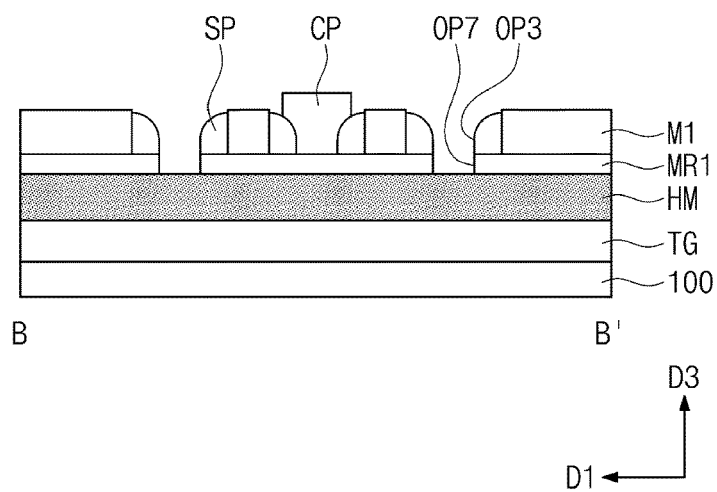

Referring to FIGS. 17A to 17C, a third patterning process may be performed using the first mask layer M1, the spacers SP, and the cut patterns CP as a mask. Therefore, the first memory layer MR1 may be patterned to form seventh openings OP7 in the first memory layer MR1. With respect to a plan view, the seventh openings OP7 of the first memory layer MR1 may have substantially the same size and shape as those of the third openings OP3 with the exception of the lack of an opening formed under the cut pattern CP.

In some embodiments, when the cut pattern CP and the first memory layer MR1 are formed of the same material (e.g., silicon oxide), the cut pattern CP may be partially etched during the third patterning process described with respect to FIGS. 17A to 17C. For example, during this third patterning process, the cut pattern CP may have its opposite sidewalls that are exposed to the third opening OP3 partially etched. The cut pattern CP may thus have a reduced width in the second direction D2 as a result of this third patterning process.

Figure 18A:
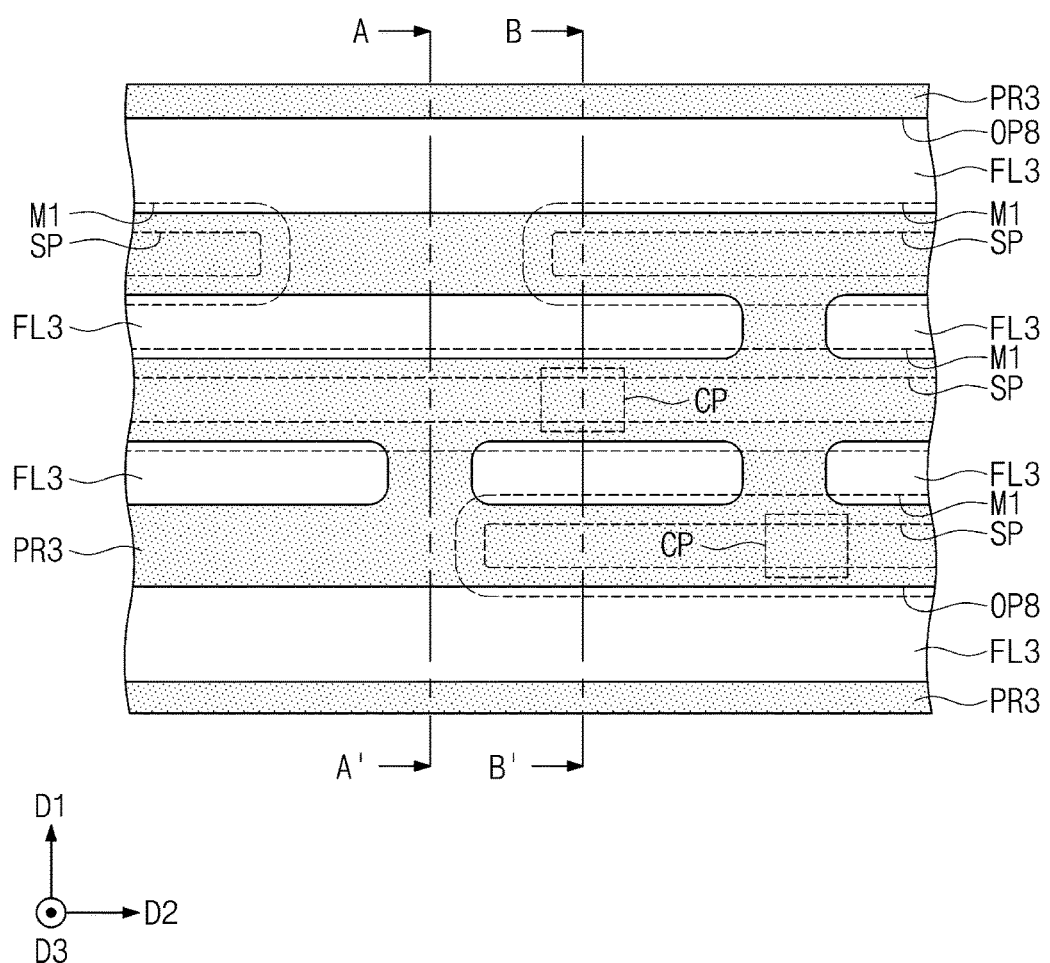
Figure 18B:
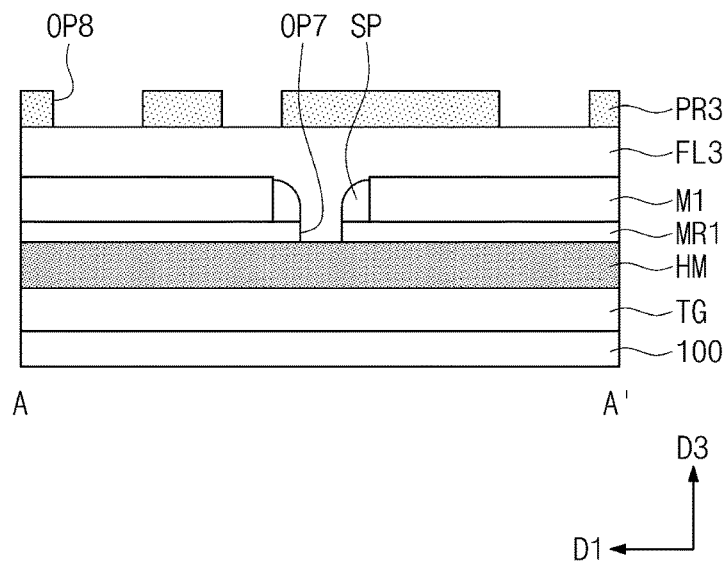
Figure 18C:
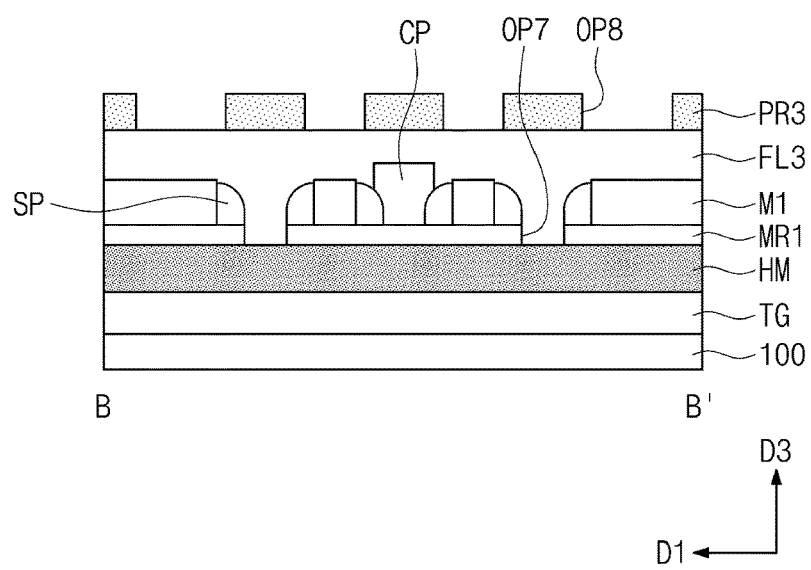

Referring to FIGS. 18A to 18C, a third filling layer FL3 may be formed on the entire surface of the substrate 100. The third filling layer FL3 may fill the seventh openings OP7.

A third photoresist pattern PR3 having eighth openings OP8 may be formed on the third filling layer FL3. For example, the formation of the third photoresist pattern PR3 may include forming a third photoresist layer on the third filling layer FL3, and then using the third photomask of FIG. 7 as a photomask to perform conventional exposure and development processes on the third photoresist layer. The third layout patterns LP3 of FIG. 7 may correspond to and be used to derive the eighth openings OP8. Some or all of the eighth openings OP8 may vertically overlap at least a portion of one of the spacers SP. For example, eighth openings OP8 may have sidewalls that are positioned directly above opening OP2 formed in first mask layer M1 (see FIGS. 11A to 11C, e.g.), such as directly above one of the spacers SP. With respect to a vertical cross section, such as that shown in FIG. 18C, an eighth opening OP8 may be positioned directly above a discrete portion of the first mask layer M1 and have sidewalls horizontally positioned to either side of this discrete portion of the first mask layer M1.

Figure 19A:
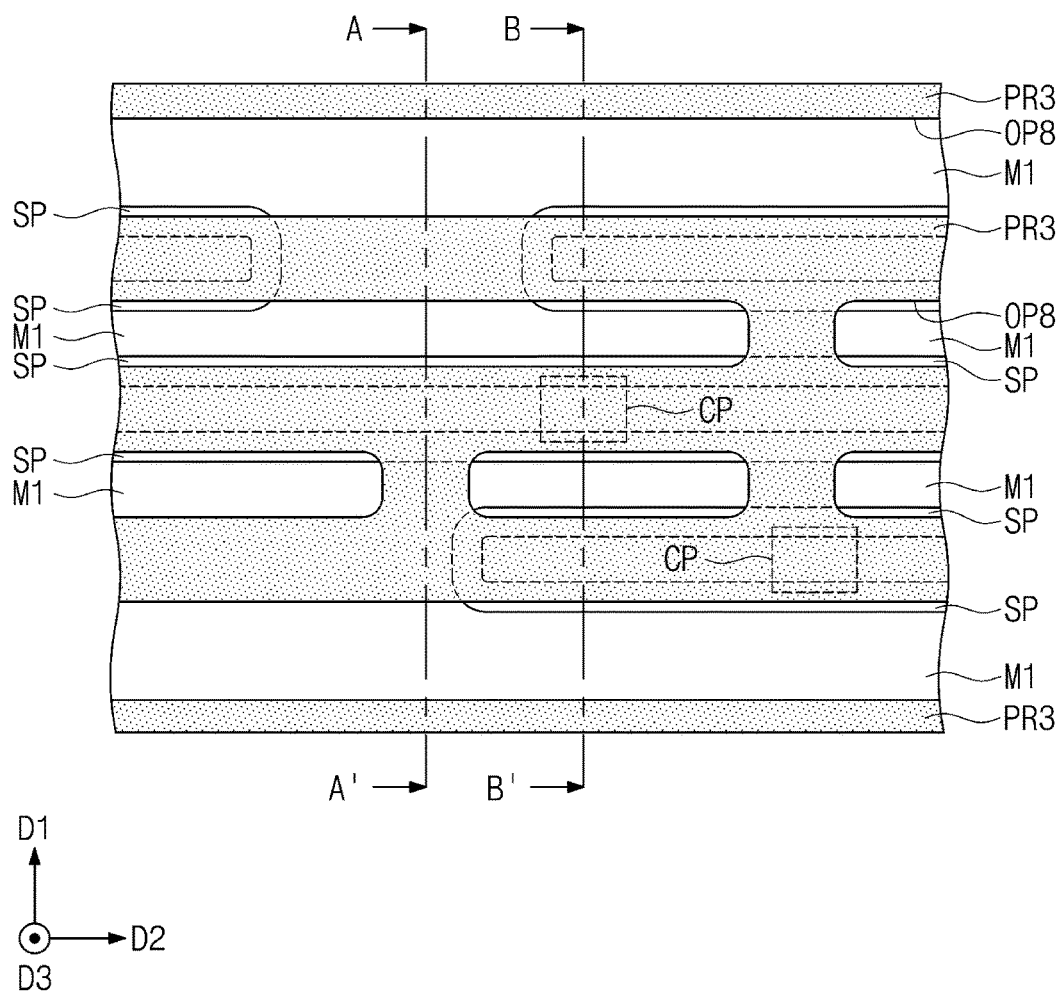
Figure 19B:
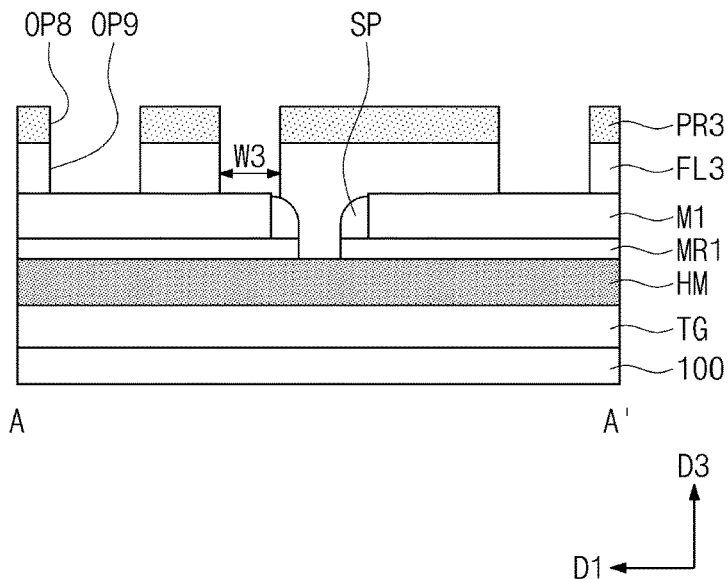
Figure 19C:
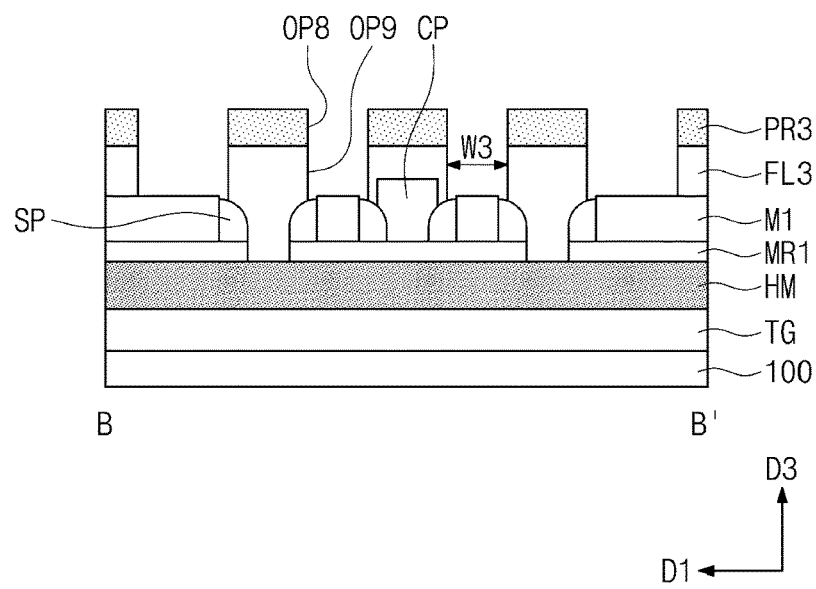

Referring to FIGS. 19A to 19C, a fourth patterning process may be performed using the third photoresist pattern PR3 as a mask. For example, the performing of the fourth patterning process may include using the third photoresist pattern PR3 as a mask to pattern the third filling layer FL3 with an anisotropic etch of those portions of the third filling layer FL3 exposed by openings OP8 of the third photoresist pattern PR3. After the fourth patterning process, remaining portions of the third photoresist pattern PR3 may be removed.

The third filling layer FL3 may be patterned with the fourth patterning process to form ninth openings OP9 in the third filling layer FL3, each corresponding to one of the eighth openings OP8 in the third photoresist pattern PR3. Each of the ninth openings OP9 of the third filling layer FL3 may have a third width W3 in the first direction D1. Portions of the ninth openings OP9 of the third filling layer FL3 may vertically overlap the spacers SP. With respect to a plan view (such as FIG. 19A), ninth openings OP9 of the third filling layer FL3 may have substantially the same shape and size as that of the eighth openings OP8 of the third photoresist pattern PR3.

Figure 20A:
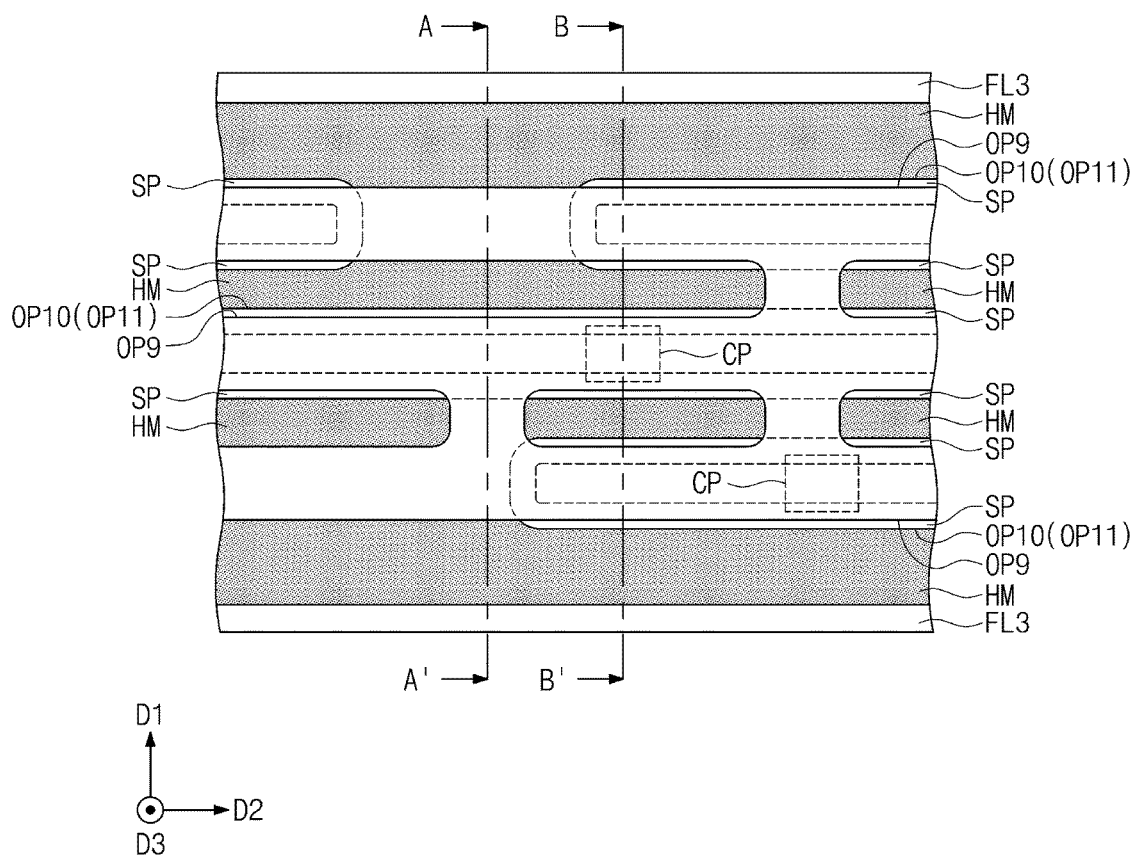
Figure 20B:
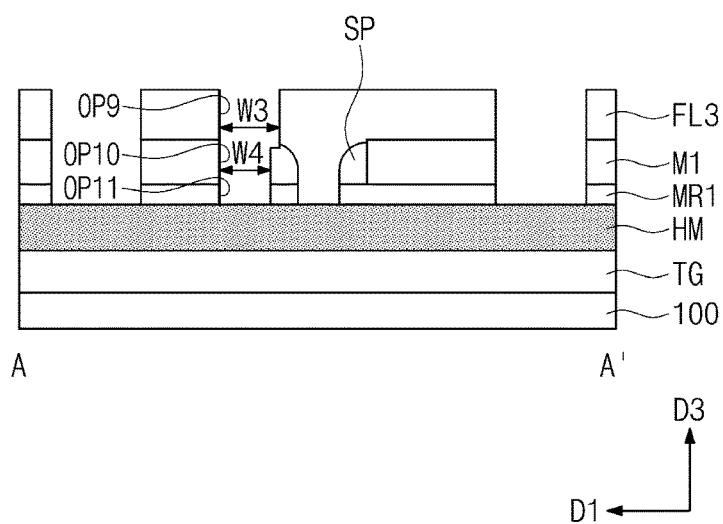
Figure 20C:
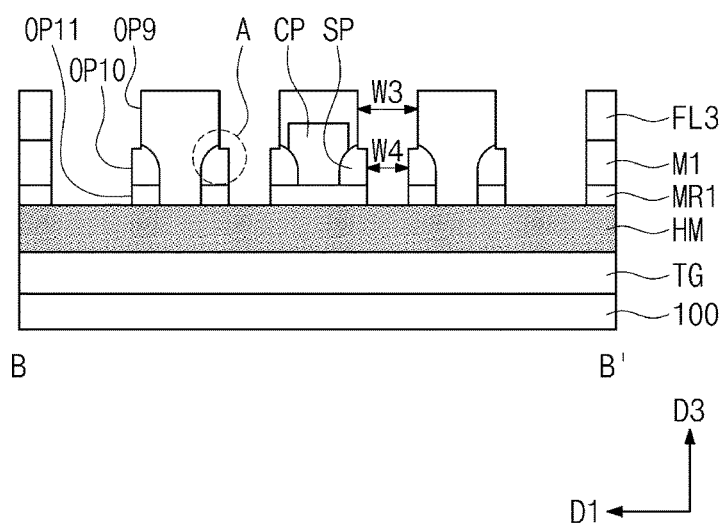
Figure 20D:
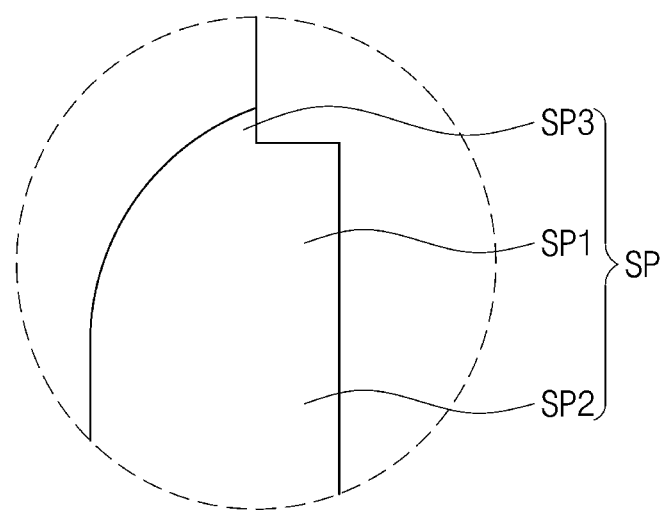
FIG. 20D illustrates an enlarged view showing section A of FIG. 20C.

Referring to FIGS. 20A to 20C, a fifth patterning process may be performed using the third filling layer FL3 and the spacers SP as a mask. For example, performing the fifth patterning process may include using the patterned third filling layer FL3 and the patterned spacers SP as a mask to pattern the first mask layer M1 with an anisotropic etch, and then using the patterned first mask layer M1 as a mask to pattern the first memory layer MR1 with an anisotropic etch.

The fifth patterning process described with respect to FIGS. 20A to 20C may form tenth openings OP10. The spacers SP may result in forming the tenth openings OP10 in a self-alignment manner. For example, the spacers SP may serve as an etching mask during the fifth patterning process. Each of the tenth openings OP10 may have width less than the width of a corresponding ninth opening OP9 that overlaps it. With respect to the cross sections of FIGS. 20B and 20C, each of the tenth openings OP10 may have a fourth width W4 in the first direction D1. The first memory layer MR1 may be patterned through the tenth openings OP10, thereby forming eleventh openings OP11.

Since portions of the ninth openings OP9 of the third filling layer FL3 vertically overlap the spacers SP, the spacers SP may serve as a mask when the first mask layer M1 is patterned. Therefore, the fourth width W4 of each of the tenth openings OP10 may be less than the third width W3 of each of the ninth openings OP9 of the third filling layer FL3. In addition, portions of the first part SP1 of the spacers SP may be removed. Thus, the first part SP1 of the spacer SP may have a portion whose top surface is flat (see FIG. 20D). A third part SP3 may result as a segment of the first part SP1 of the spacer SP that is higher than the portion of the first part SP1 of the spacer SP that has the flat top surface. For example, the third part SP3 of the spacer SP may be located at a level higher than that of the flat top surface of the first part SP1.

Figure 21A:
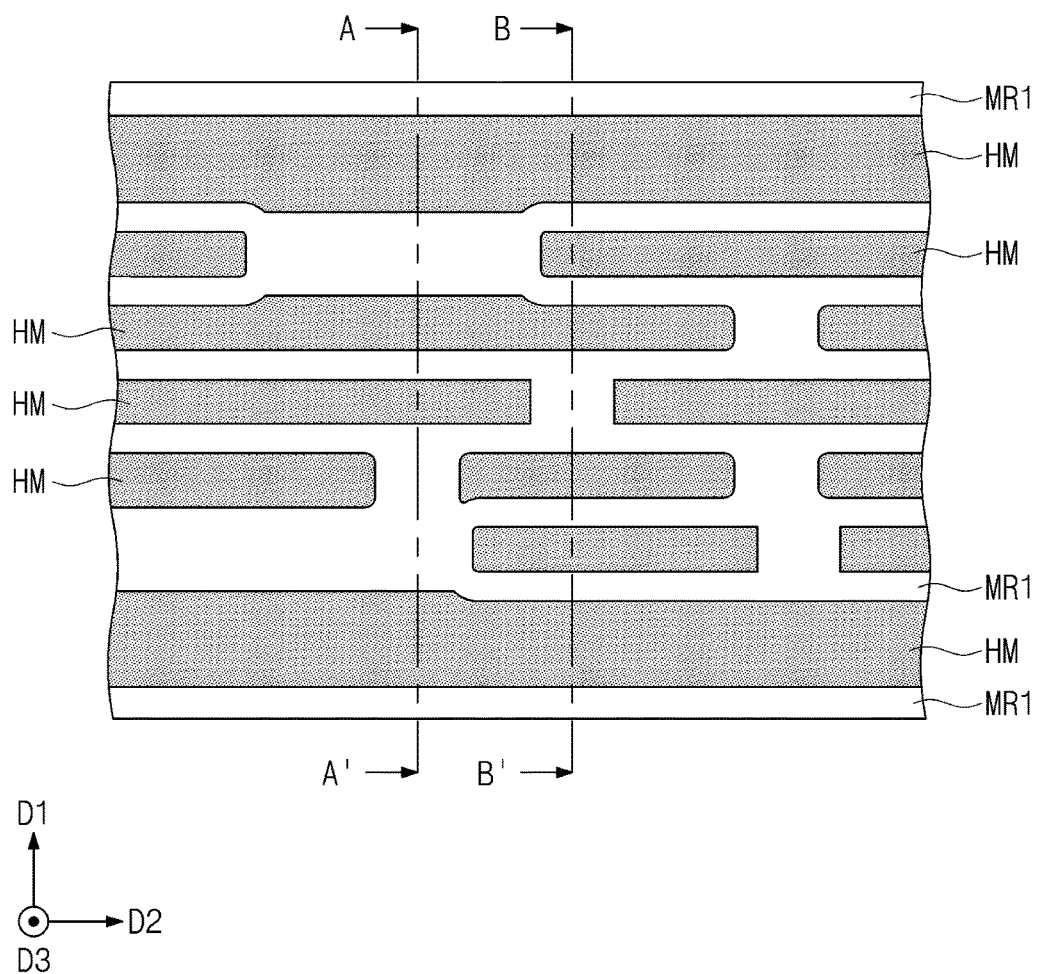
Figure 21B:
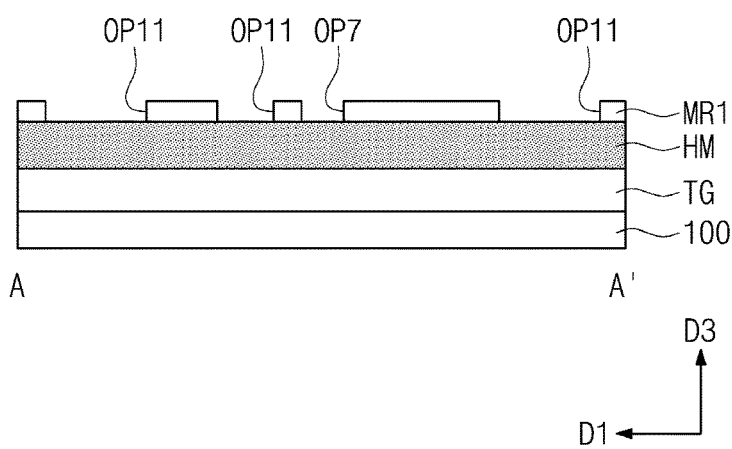
Figure 21C:
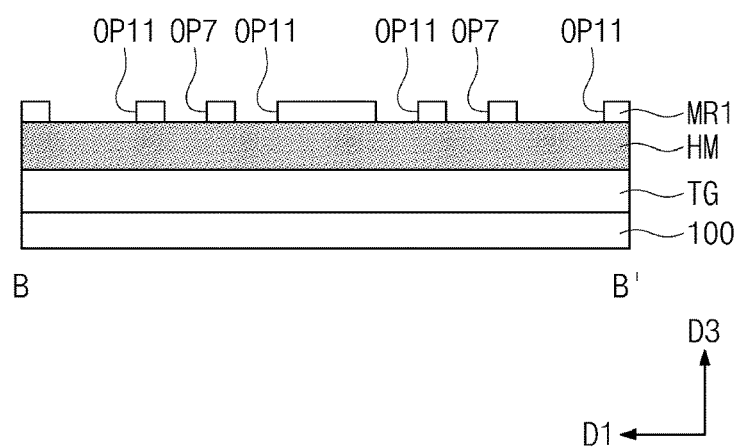

Referring to FIGS. 21A to 21C, a removal process may be performed on the third filling layer FL3, the first mask layer M1, the cut pattern CP, and the spacers SP that remain after the fifth patterning process. When the cut pattern CP is formed of the same material as that of the spacers SP, the cut pattern CP and the spacers SP may be removed simultaneously.

Figure 22A:
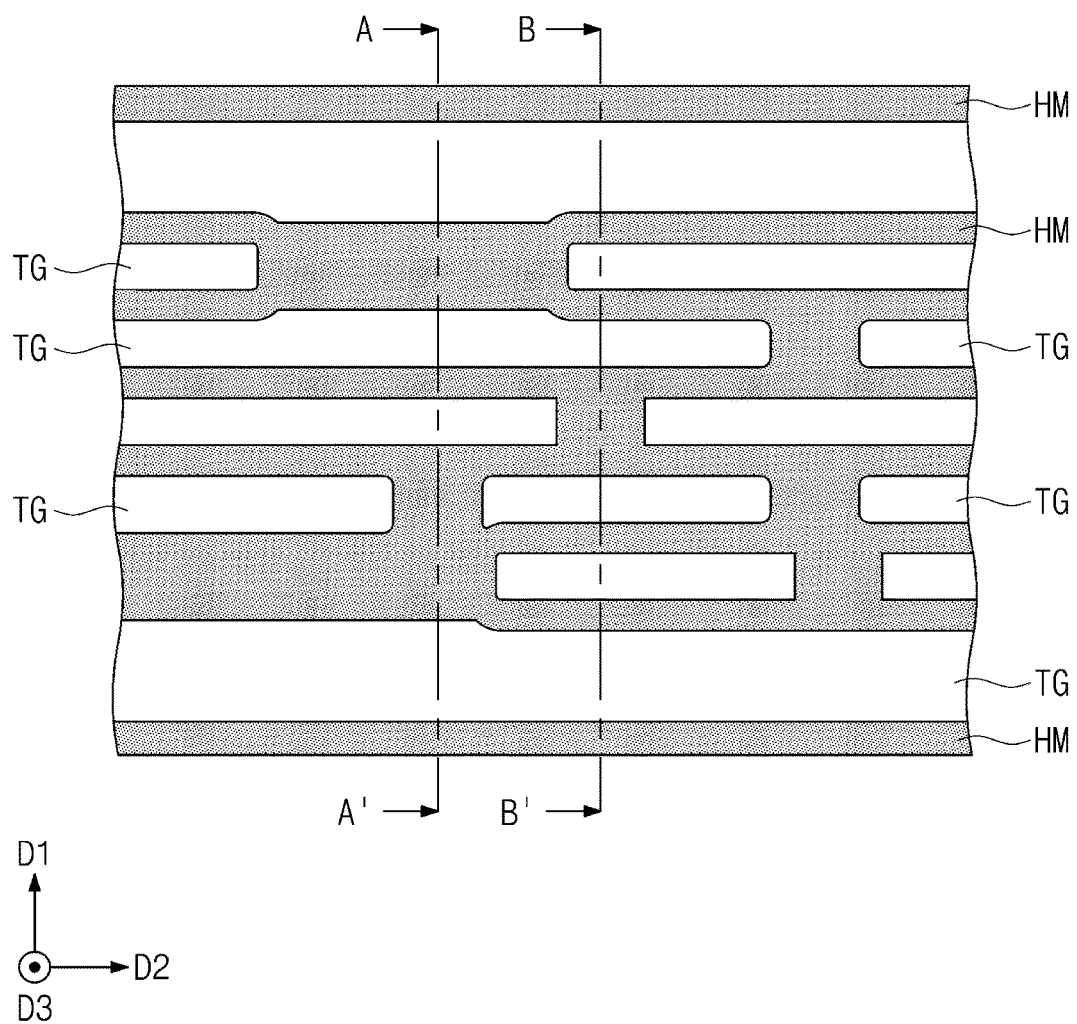
Figure 22B:
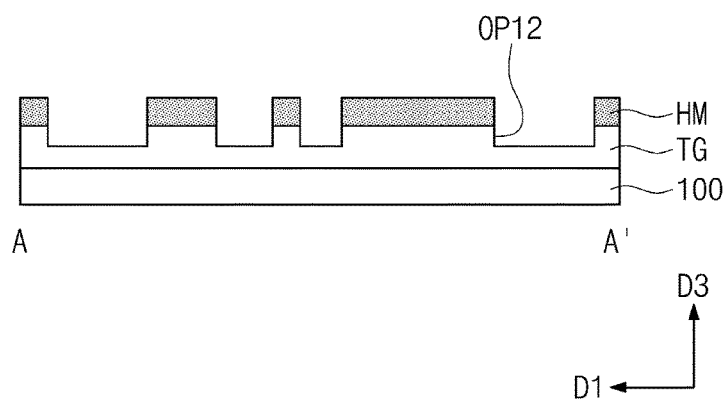
Figure 22C:
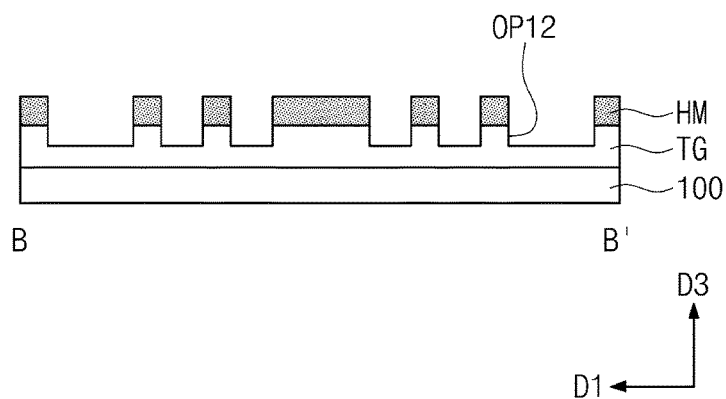

Referring to FIGS. 22A to 22C, a sixth patterning process may be performed using the first memory layer MR1 as a mask. For example, the performing of the sixth patterning process may include using the first memory layer MR1 as a mask to pattern the hardmask layer HM, and then using the patterned hardmask layer HM as a mask to pattern the target layer TG. The target layer TG may be patterned to form twelfth openings OP12. A removal process may be performed on the first memory layer MR1 and the hardmask layer HM that remain after the sixth patterning process.

Figure 23A:
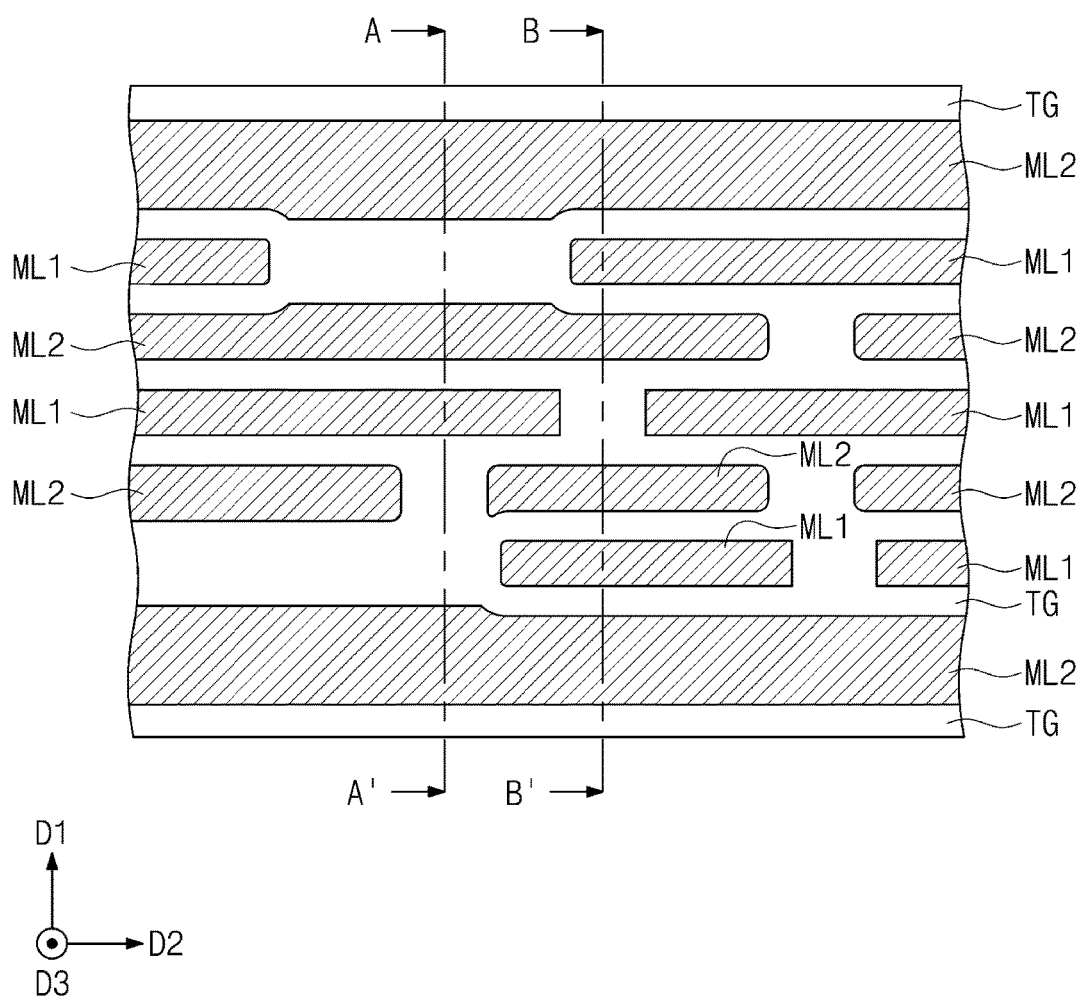
Figure 23B:
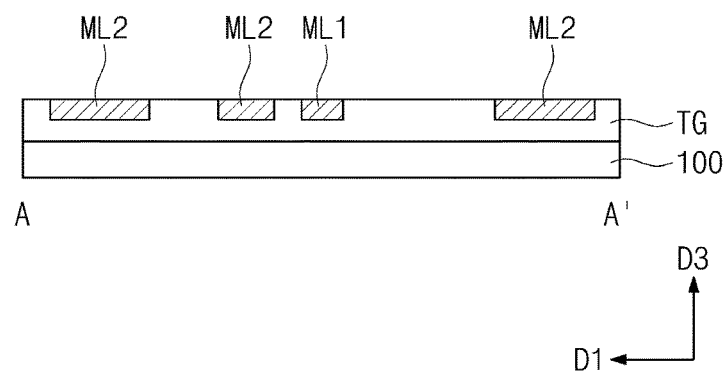
Figure 23C:
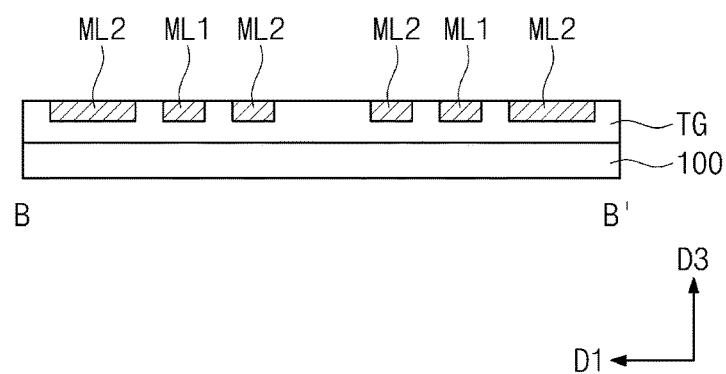

Referring to FIGS. 23A to 23C, the twelfth openings OP12 of the target layer TG may be filled with metal to form a metal layer and planarized to form first metal lines ML1 and second metal lines ML2 in twelfth openings OP12. The first and second metal lines ML1 and ML2 may include copper (Cu) or tungsten (W). The first metal lines ML1 may correspond to and be defined by the first layout patterns LP1 of FIG. 7, and the second metal lines ML2 may correspond to and be defined by the third layout patterns LP3 of FIG. 7. When viewed in plan, the first and second metal lines ML1 and ML2 may be spaced apart from each other.

As shown in FIG. 23A, an alternating sequence of first and second metal lines ML1 and ML2 may be formed, comprising a plurality of first metal lines ML1 and second metal line ML2 extending in parallel (e.g., in the second direction D2). Each neighboring pair of first metal lines ML1 may have one second metal line ML2 interposed therebetween, and each neighboring pair of second metal lines ML2 may have one first metal line ML1 interposed therebetween. For a particular region (e.g., below the uppermost metal line ML2 and above the lowermost metal line ML2 in FIG. 23A), the pitch between the metal lines ML1, ML2 may be substantially the same and the spacing between the metal lines ML1, ML2 may be the same. In addition, widths (e.g., in the D1 direction) of the first metal lines ML1 may be the substantially the same and widths of the second metal lines ML2 may be substantially the same, while widths of these first metal lines ML1 may be different from widths of the second metal lines ML2 (although they also may be made the same). For example, widths of the second metal lines ML2 may be greater than widths of the first metal lines ML1. Distances between immediately neighboring metal lines of this group of metal lines may be substantially the same. Widths of the metal lines ML1 and ML2 may be made less than the resolution of the exposure apparatus used in the photolithographic exposure processes described herein (e.g., less than the minimum width of openings that may be formed in the photoresist layers described herein).

According to some exemplary embodiments of inventive concepts, a method of manufacturing a semiconductor device may use a plurality of photomasks as a mask to form metal lines that are highly integrated on a substrate. A spacer may be used to minimize or reduce widths of patterns.

Although the present invention has been described in connection with the embodiments of inventive concepts illustrated in the accompanying drawings, it will be understood to those skilled in the art that various changes and modifications may be made without departing from the technical spirit and essential feature of inventive concepts. It should be appreciated that ordinal numbers used herein, such as "first," "second," "third," etc., are often used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in the specification) may be described elsewhere with a different ordinal number (e.g., "second" in a claim). Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise. It should also be appreciated, unless context indicates otherwise, that openings referenced herein may be with respect to a particular layer and may be considered to exist even after such openings are later filled. Finally, it should be appreciated that the memory layers referenced herein need not form a part of a memory circuit, a memory cell or any part of a memory device, but may refer to layers that may be used obtain a pattern having been formed in another layer of the semiconductor device.

What is claimed is:

1. A method of manufacturing a semiconductor device, the method comprising:

sequentially forming a target layer and a first mask layer on a substrate;
patterning the first mask layer to form a first opening in the first mask layer;
forming a spacer on an inner sidewall of the first opening;
forming on the first mask layer a first photoresist pattern having a second opening vertically overlapping at least a portion of the spacer;
forming a third opening in the first mask layer adjacent to the first opening by using the spacer as a mask to remove a portion of the first mask layer that is exposed to the second opening; and
after forming the third opening, using the first mask layer and the spacer as a mask to pattern the target layer,
wherein patterning the first mask layer to form the first opening comprises:
forming a second photoresist pattern on the first mask layer;
using the second photoresist pattern as a mask to pattern the first mask layer to include initial openings formed therein; and
etching a sidewall of the patterned first mask layer to expand the initial openings formed in the first mask layer.

2. The method of claim 1, wherein a width of the second opening is greater than a width of the third opening.

3. The method of claim 1,
wherein patterning the first mask layer to form the first opening further comprises forming a protective layer covering a top surface of the first mask layer,
wherein, when the sidewall of the patterned first mask layer is etched, the protective layer protects the top surface of the first mask layer.

4. A method of manufacturing a semiconductor device, the method comprising:
sequentially forming a target layer and a first mask layer on a substrate;
patterning the first mask layer to form a first opening in the first mask layer;
forming a spacer on an inner sidewall of the first opening;
forming a cut pattern covering at least a portion of the spacer,
wherein forming the cut pattern comprises:
forming a first filling layer covering at least a portion of the spacer; and
removing a portion of the first filling layer;
forming on the first mask layer a first photoresist pattern having a second opening vertically overlapping at least a portion of the spacer;
forming a third opening in the first mask layer adjacent to the first opening by using the spacer as a mask to remove a portion of the first mask layer that is exposed to the second opening; and
after forming the third opening, using the first mask layer and the spacer as a mask to pattern the target layer.

5. The method of claim 4, wherein the cut pattern and the spacer are formed of the same material.

6. The method of claim 4, wherein the cut pattern and the first mask layer are formed of the same material.

7. The method of claim 4, further comprising forming a first memory layer between the target layer and the first mask layer,
wherein the cut pattern and the first memory layer are formed of the same material.

8. The method of claim 4, wherein removing the portion of the first filling layer comprises performing a chemical mechanical polishing (CMP) process to form a discrete portion of the first filling layer positioned within the first opening with respect to a plan view and performing an etch-back process to reduce a height of the discrete portion of the first filling layer.

9. The method of claim 4, wherein forming the cut pattern further comprises etching sidewalls of the cut pattern to reduce a width of the cut pattern.

10. A method of manufacturing a semiconductor device, the method comprising:
sequentially forming a target layer and a first mask layer on a substrate;
performing a first photolithography process to form a first opening in the first mask layer;
forming a spacer on an inner sidewall of the first opening, the spacer defining a second opening within the first opening;
forming a cut pattern covering at least a portion of the spacer,
wherein forming the cut pattern comprises:
forming a first filling layer covering the spacer; and
removing a portion of the first filling layer; and
performing a second photolithography process to form in the first mask layer a third opening immediately adjacent to the second opening with the spacer disposed between the second opening and the third opening,
wherein the third opening is formed in a self-aligned manner using the spacer.

11. The method of claim 10, wherein forming the third opening comprises removing a portion of the spacer.

12. The method of claim 10, wherein removing the portion of the first filling layer comprises performing an etch-back process to remove the portion of the first filling layer.

13. The method of claim 10, further comprising etching sidewalls of the cut pattern to reduce a width of the cut pattern.

* * * * *